United States Patent
Summerfelt et al.

(10) Patent No.: US 8,472,236 B2
(45) Date of Patent: Jun. 25, 2013

(54) DIFFERENTIAL PLATE LINE SCREEN TEST FOR FERROELECTRIC LATCH CIRCUITS

(71) Applicant: Texas Instruments Incorporated, Dallas, TX (US)

(72) Inventors: Scott R. Summerfelt, Garland, TX (US); John Anthony Rodriguez, Dallas, TX (US); Hugh P. McAdams, McKinney, TX (US); Steven Craig Bartling, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/626,531

(22) Filed: Sep. 25, 2012

(65) Prior Publication Data
US 2013/0021833 A1    Jan. 24, 2013

Related U.S. Application Data

(62) Division of application No. 13/445,076, filed on Apr. 12, 2012, which is a division of application No. 12/781,601, filed on May 17, 2010.

(60) Provisional application No. 61/180,322, filed on May 21, 2009.

(51) Int. Cl.
*G11C 11/22*    (2006.01)

(52) U.S. Cl.
USPC .......................................... 365/145; 365/148

(58) Field of Classification Search
USPC ......... 365/49.13, 65, 109, 117, 145; 257/295, 257/E21.208, E21.663, E21.664, E27.104, 257/E29.164
See application file for complete search history.

(56) References Cited

U.S. PATENT DOCUMENTS

| | | | | |
|---|---|---|---|---|
| 5,798,964 A * | 8/1998 | Shimizu et al. | | 365/145 |
| 5,892,706 A * | 4/1999 | Shimizu et al. | | 365/145 |
| 6,438,020 B1 * | 8/2002 | Yamada | | 365/145 |
| 6,853,576 B2 * | 2/2005 | Kato et al. | | 365/145 |
| 7,813,193 B2 | 10/2010 | Rodriguez et al. | | |
| 2004/0042286 A1 * | 3/2004 | Kato et al. | | 365/200 |

OTHER PUBLICATIONS

Miwa et al., "A 512 Kbit low-voltage NV-SRAM with the size of a conventional SRAM", Digest of Technical Papers: 0 Symposium on VLSI Circuits, Paper 12-4 (IEEE, 2001), pp. 129-132.

(Continued)

*Primary Examiner* — Harry W Byrne
(74) *Attorney, Agent, or Firm* — Rose Alyssa Keagy; Wade J. Brady, III; Frederick J. Telecky, Jr.

(57) ABSTRACT

Non-volatile latch circuits, such as in memory cells and flip-flops, that are constructed for reliability screening. The non-volatile latch circuits each include ferroelectric capacitors coupled to storage nodes, for example at the outputs of cross-coupled inverters. Separate plate lines are connected to the ferroelectric capacitors of the complementary storage nodes. A time-zero test of the latch stability margin is performed by setting a logic state at the storage nodes, then programming the state into the ferroelectric capacitors by polarization. After power-down, the plate lines are biased with a differential voltage relative to one another, and the latch is then powered up to attempt recall of the programmed state. The differential voltage disturbs the recall, and provides a measure of the cell margin and its later-life reliability.

10 Claims, 14 Drawing Sheets

OTHER PUBLICATIONS

Masui et al., "Design and Applications of Ferroelectric Nonvolatile SRAM and Flip-Flop with Unlimited Read/Program 2 Cycles and Stable Recall", Proceedings of the Custom Integrated Circuits Conference, Paper 16-6-1 (IEEE, 2003), pp. 403-406.

Masui et al., "A Ferroelectric Memory-Based Secure Dynamically Programmable Gate Array"J. Solid State Circuits, vol. 38, No. 5 (IEEE, May 2003), pp. 715-725.

Joint Industry Standard: Moisture/Reflow Sensitivity Classification for Nonhermetic Solid State Surface Mount Devices, IPC/JEDEC J-STD-020D.1 (Mar. 2008), pp. 4, 7, and 8.

Sheikholeslami et al., "A Survey of Circuit Innovations in Ferroelectric Random-Access Memories", Proceedings 0 the IEEE, vol. 88, No. 5 (May 2000), pp. 667-689.

* cited by examiner

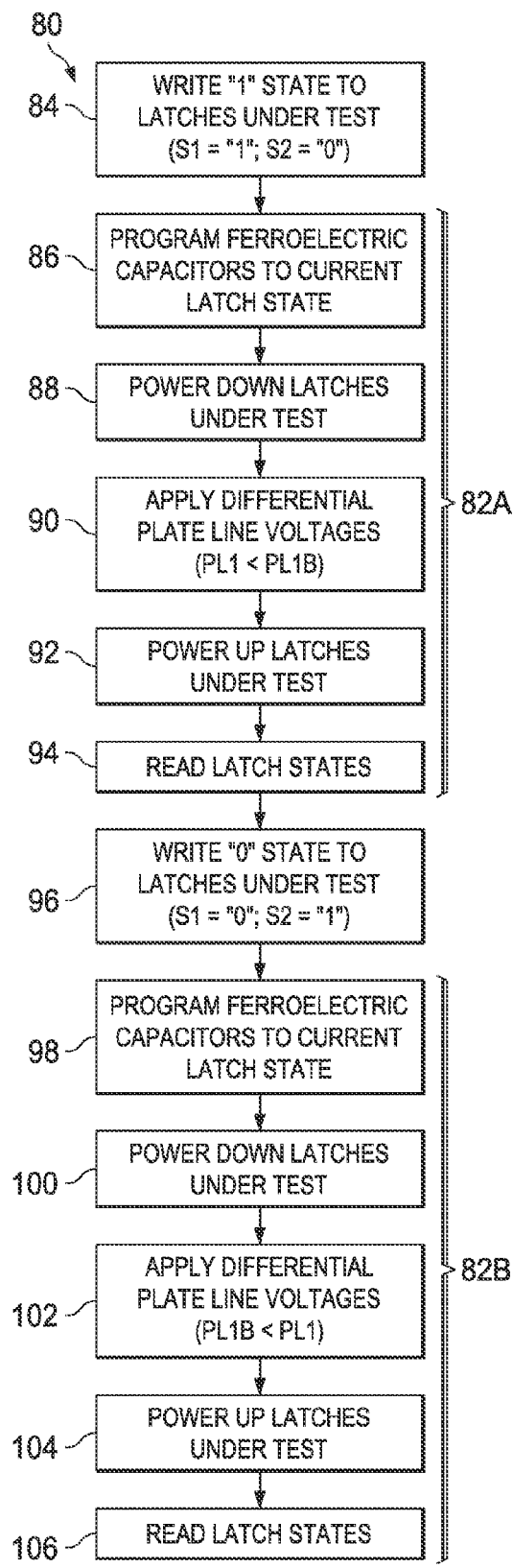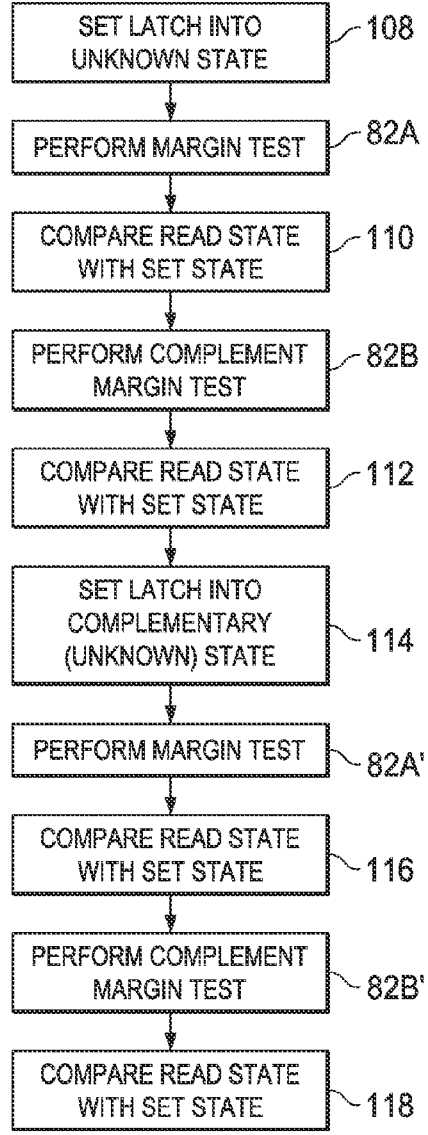
FIG. 6a
FIG. 6b

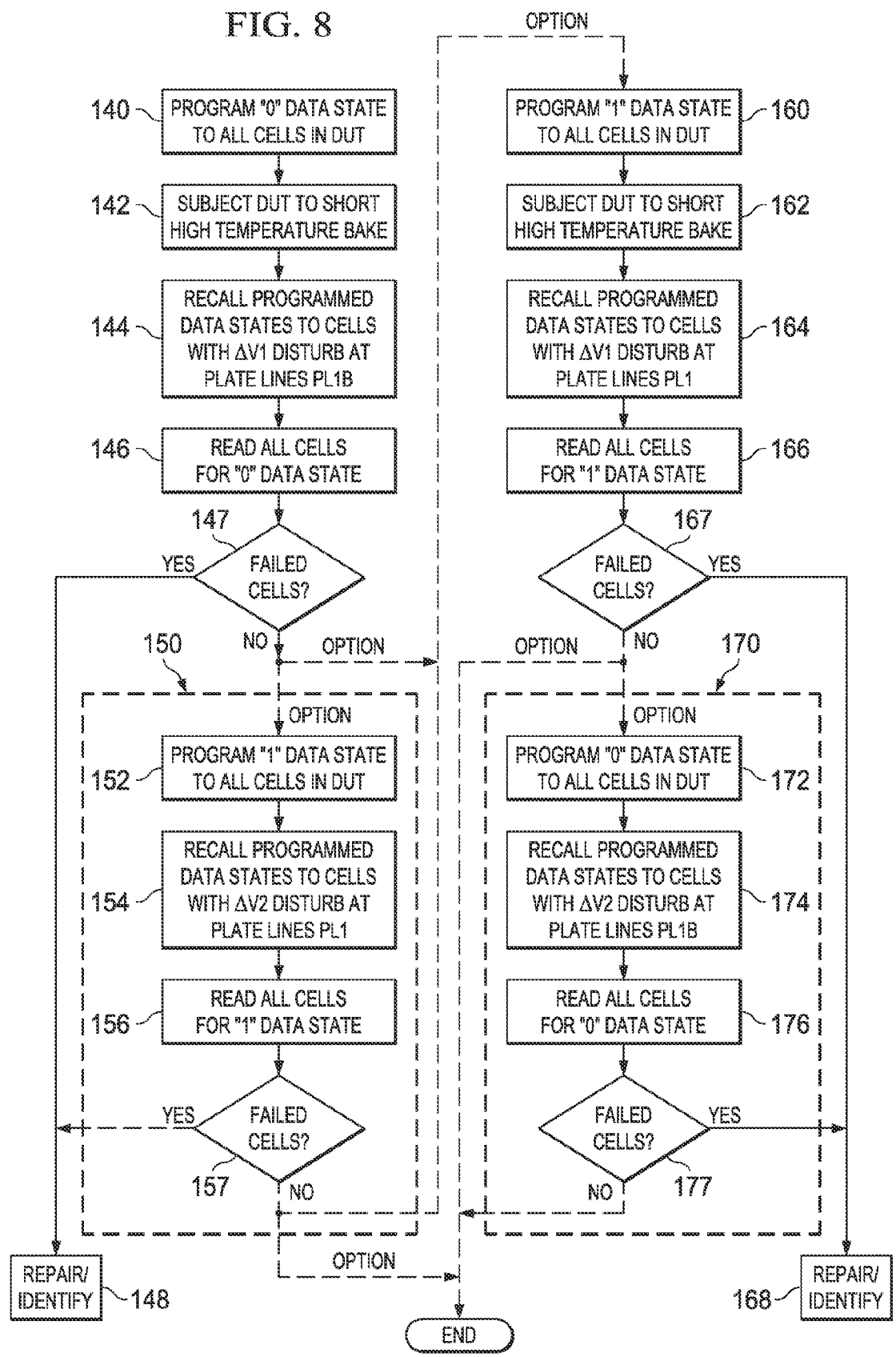

DIFFERENTIAL PLATE LINE SCREEN TEST FOR FERROELECTRIC LATCH CIRCUITS

CROSS-REFERENCE TO RELATED APPLICATIONS

This application is a divisional of U.S. application Ser. No. 13/445,076 filed Apr. 12, 2012, which claims priority to U.S. application Ser. No. 12/781,601, filed May 17, 2010, which claims priority, under 35 U.S.C. §119(e), to Provisional Application No. 61/180,322, filed May 21, 2009, the contents of all are herein incorporated by reference.

STATEMENT REGARDING FEDERALLY SPONSORED RESEARCH OR DEVELOPMENT

Not applicable.

BACKGROUND OF THE INVENTION

This invention is in the field of semiconductor integrated circuits. Embodiments of this invention are more specifically directed to reliability screening of non-volatile storage elements in such integrated circuits.

Conventional metal-oxide-semiconductor (MOS) and complementary MOS (CMOS) logic and memory devices are prevalent in modern electronic devices and systems, as they provide an excellent combination of fast switching times and low power dissipation, along with their high density and suitability for large-scale integration. As is fundamental in the art, however, those devices are essentially volatile, in that logic and memory circuits constructed according to these technologies do not retain their data states upon removal of bias power. Especially in mobile and miniature systems, the ability to store memory and logic states in a non-volatile fashion is very desirable. As a result, various technologies for constructing non-volatile devices have been developed in recent years.

A recently developed technology for realizing non-volatile solid-state memory devices involves the construction of capacitors in which the dielectric material is a polarizable ferroelectric material, such as lead zirconate titanate (PZT) or strontium-bismuth-tantalate (SBT). Hysteresis in the charge-vs.-voltage (Q-V) characteristic, based on the polarization state of the ferroelectric material, enables the non-volatile storage of binary states in those capacitors. In contrast, conventional MOS capacitors lose their stored charge on power-down of the device. It has been observed that ferroelectric capacitors can be constructed by processes that are largely compatible with modern CMOS integrated circuits, for example placing capacitors above the transistor level, between overlying levels of metal conductors.

FIG. 1 illustrates an example of a Q-V characteristic of a conventional ferroelectric capacitor. As shown, the charge (Q) stored across the conductive plates depends on the voltage applied to the plates (V), and also on the recent history of that voltage. If the voltage V applied across the capacitor plates exceeds a "coercive" voltage $+V_\alpha$, the capacitor polarizes into the "+1" state. According to this characteristic, once polarized to the "+1" state, so long as voltage V remains above coercive voltage $-V_\beta$, the capacitor exhibits a stored charge of $+Q_1$. Conversely, if the voltage V applied across the capacitor plates is more negative than coercive voltage $-V_\beta$, the capacitor is polarized into the "−1" state, and will exhibit a stored charge of $-Q_2$ for applied voltage V below $+V_\alpha$.

An important characteristic of ferroelectric capacitors, for purposes of non-volatile storage in integrated circuits, is the different capacitance exhibited by a ferroelectric capacitor in its polarized states. As fundamental in the art, the capacitance of an element refers to the ratio of stored charge to applied voltage. In the context of a ferroelectric capacitor, the change in polarization state that occurs upon application of a polarizing voltage is reflected in charge storage. For example, referring to FIG. 1, the polarization of a ferroelectric capacitor from its "−1" state to its "+1" state is reflected in a relatively high capacitance C(−1), by way of which polarization charge involved in the change of polarization state is retained within the capacitor as the voltage exceeds its coercive voltage $V_\alpha$; on the other hand, a capacitor already in its "+1" state exhibits little capacitance C(+1) due to polarization, since its ferroelectric domains are already aligned prior to the application of the voltage. In each case, the ferroelectric capacitor also has a linear capacitance, by virtue of its construction as parallel plates separated by a dielectric film (i.e., the ferroelectric material). As will be evident from the following description, a stored logic state is read by interrogating the capacitance of ferroelectric capacitors to discern its polarized state.

Ferroelectric technology is now utilized in on-volatile solid-state read/write memory devices. These memory devices, commonly referred to as "ferroelectric RAM", or "FeRAM", or "FRAM" devices, are now commonplace in many electronic systems, particularly portable electronic devices and systems. FeRAM memories are especially attractive in implantable medical devices, such as pacemakers and defibrillators.

FIG. 2a illustrates one example of a conventional FeRAM memory cell, as described in Miwa et al., "A 512 Kbit low-voltage NV-SRAM with the size of a conventional SRAM", *Digest of Technical Papers: Symposium on VLSI Circuits*, Paper 12-4 (IEEE, 2001), pp. 129-132, incorporated herein by reference. Cell 10 is constructed essentially in the form of a typical CMOS static RAM (SRAM) cell, with cross-coupled inverters forming a latch. In this example, one inverter is formed of p-channel transistor 2P and n-channel transistor 2N with their source-drain paths connected in series between power supply node PWR (which, in normal operation, provides the power supply voltage $V_{dd}$) and ground, and the other inverter is formed of p-channel transistor 3P and n-channel 3N, with their source-drain paths also connected in series between power supply node PWR and ground. These inverters are cross-coupled by storage node S1 at the drains of transistors 2P, 2N being connected to the gates of transistors 3P, 3N, and storage node S2 at the drains of transistors 3P, 3N being connected to the gates of transistors 2P, 2N. N-channel MOS pass transistor 4A has its source-drain path connected between storage node S1 and bit line BL, and its gate connected to word line WL; similarly, n-channel MOS pass transistor 4B has its source-drain path connected between storage node S2 and bit line BLB, and its gate also connected to word line WL. In a write operation, the complementary logic levels at storage nodes S1, L2 are written from a differential signal at bit lines BL, BLB upon word line WL turning on pass gates 4A, 4B; conversely, the state of storage nodes S1, L2 can be read by energizing word line WL and sensing the differential signal on bit line pair BL, BLB. The states at storage nodes S1, L2 remain latched while cell 10 is powered-up.

Ferroelectric capacitors 5A, 5B in cell 10 provide its non-volatile capability. In this example, capacitor 5A is connected between storage node S1 and plate line PL, and capacitor 5B is connected between storage node S2 and plate line PL. Once the state of cell 10 is present at storage nodes S1, L2, plate line PL remains at an intermediate level (e.g., $V_{dd}/2$) for both read and write operations, whether cell 10 is selected or not, so long as cell 10 is powered up. In this conventional case, capacitors 5A, 5B can be programmed to store a current state at storage nodes S1, L2 by driving plate line PL to a high voltage (e.g., power supply voltage $V_{dd}$) and then to a low voltage (e.g., ground). For example, if storage node S1 is at a high level and storage node S2 is at a low level, the high voltage level on plate line PL (greater than coercive voltage $+V_\alpha$, considering plate line PL relative to storage node S2) will polarize capacitor 5B to a "+1" state (as shown in FIG. 1); capacitor 5A does not polarize at this point. Conversely, the low voltage level on plate line PL (more negative than coercive voltage $-V_\beta$, considering plate line PL relative to storage node S1) will polarize capacitor 5A to a "−1" state; the polarization of capacitor 5B is not affected. These polarization states will remain on capacitors 5A, 5B, even after cell 10 is powered-down.

To recall the state of cell 10 as retained at capacitors 5A, 5B, plate line PL is held at a low voltage (e.g., ground) while cell 10 is powered up. Referring to FIG. 1, the powering-up of cell 10 effectively moves the applied voltage in the negative direction from the "0" voltage axis. As the voltage at power supply node PWR increases toward $V_{dd}$, the voltage across capacitors 5A, 5B crosses coercive voltage $-V_\beta$, and capacitor 5B begins polarizing. The change in polarization of capacitor 5B causes its effective capacitance to be greater than that of capacitor 5A. This causes storage node S1 to rise toward power supply voltage $V_{dd}$ faster than does storage node S2; the latch action of cell 10 will then drive storage nodes S1, S2 to their previous state, setting the state of the latch. The polarization state of capacitor 5B is destroyed in this recall (or "restore") operation; this recall is thus a generally destructive read.

FIG. 2b illustrates another example of a conventional FeRAM cell 10', as described in Masui et al., "Design and Applications of Ferroelectric Nonvolatile SRAM and Flip-Flop with Unlimited Read/Program Cycles and Stable Recall", *Proceedings of the Custom Integrated Circuits Conference*, Paper 16-6-1 (IEEE, 2003), pp. 403-406; and in Masui et al., "A Ferroelectric Memory-Based Secure Dynamically Programmable Gate Array", *J. Solid State Circuits*, Vol. 38, No. 5 (IEEE, May 2003), pp. 715-725; both incorporated herein by reference. Cell 10' of FIG. 2b is similarly constructed as cell 10 of FIG. 2a, with the same reference numerals used for similar elements, but includes two additional ferroelectric capacitors 7A, 7B. Capacitor 7A is connected between storage node S1 and plate line PL2, and capacitor 7B is connected between storage node S2 and plate line PL2; plate line PL1 refers to the plate line connected to capacitors 5A, 5B in this FIG. 2b. Capacitors 7A, 7B are much larger capacitors than their capacitors 5A, 5B, for example having three times the dielectric area and thus three times the linear capacitance. The operation of cell 10' in its read and write operations is essentially the same as that of cell 10 of FIG. 2a, however both plate lines PL1, PL2 may be maintained at ground potential in normal operation for read and write cycles of cell 10' as an SRAM cell. Programming of ferroelectric capacitors 5A, 5B, 7A, 7B in cell 10' is accomplished in similar fashion as described above. In this case, both plate lines PL1, PL2 are driven to a high voltage (e.g., $V_{dd}$) and then to a low voltage (e.g., ground) while cell 10' remains powered up. The logic level at storage node S1 determines the polarization of capacitors 5A, 7A, while the logic level at storage node S2 determines the polarization of capacitors 5B, 7B.

Plate lines PL1, PL2 receive separate voltages during the recall operation in this cell 10'. Recall begins with plate lines PL1, PL2 at a low voltage (e.g., ground), while pass transistors 4A, 4B are held off by word line WL at an inactive low level. Plate line PL1 is then driven to a high voltage (e.g., $V_{dd}$) while plate line PL2 remains at a low voltage, at which point cell 10' is powered up. With plate line PL1 at $V_{dd}$ and plate line PL2 at ground, the voltages at storage nodes S1, S2 are based on a voltage divider of the capacitances of ferroelectric capacitors 5A, 5B, 7A, 7B, which depends on their differing polarization states.

For example, if storage node S1 is at a high logic level and storage node S2 at a low logic level, programming of ferroelectric capacitors 5A, 5B, 7A, 7B will result in ferroelectric capacitors 5A, 7A polarized to the "−1" state, and ferroelectric capacitors 5B, 7B polarized to the "+1" state. In the recall operation, with plate line PL1 at $V_{dd}$ and plate line PL2 at ground, the voltage divider of ferroelectric capacitors 5A, 5B, 7A, 7B at each of storage nodes S1, S2 operates as:

$$V_s = V_{dd}\left(\frac{C_5}{C_5 + C_7}\right)$$

where $V_S$ is the voltage at one of storage nodes S1, S2, $C_5$ is the capacitance of its associated ferroelectric capacitor 5, and $C_7$ is the capacitance of its associated ferroelectric capacitor 7 ($C_7 > C_5$ in this example, as described above). In this case, ferroelectric capacitor 5A at storage node S1 has a higher capacitance because of its "−1" polarization state than will ferroelectric capacitor 5B in its "+1" state. Accordingly, the voltage $V_{S1}$ at storage node S1 will be higher than the voltage $V_{S2}$ at storage node S2, by virtue of the higher effective capacitance of capacitor 5A than that of capacitor 5B. One can also consider this effect as storage node S1 being charged by the polarization charge from capacitor 5A as changes its polarization state; storage node S2 does not receive this polarization charge, because capacitor 5B is not changing state. As a result, as cell 10' is powered-up, the differential voltage at storage nodes S1, S2 established by ferroelectric capacitors 5A, 5B, 7A, 7B is latched into the cross-coupled inverters of cell 10', with storage node S1 latched high and storage node S2 latched low in this example. As before, this restore operation is destructive of the programmed state, requiring reprogramming of capacitors 5A, 5B, 7A, 7B when appropriate.

Ferroelectric capacitors are now also implemented in logic circuits, for example to store the state of latch nodes upon power-down, so that this previous state can be restored on power-up. Another use of ferroelectric capacitors in logic circuits is to provide non-volatile storage of configuration information, so that power-up of the logic circuit will immediately load that stored configuration information into various latch nodes within the logic circuit. These and other uses of non-volatile elements such as ferroelectric capacitors in logic circuits are becoming popular.

FIG. 2c illustrates an example of conventional ferroelectric flip-flop 16, as used in the data or control flow of a large-scale logic circuit, and in which ferroelectric capacitors 15A, 15B, 17A, 17B operate to store the state of flip-flop 16 on power-down, and to restore that logic state as it is again powered-up. The construction and operation of an example of a flip-flop such as that shown in FIG. 2c is described in Masui et al., "Design and Applications of Ferroelectric Nonvolatile SRAM and Flip-Flop with Unlimited Read/Program Cycles and Stable Recall", *Proceedings of the Custom Integrated Circuits Conference*, Paper 16-6-1 (IEEE, 2003), pp. 403-406, incorporated herein by reference. In the simplified example of FIG. 2c, input data line D is received at pass gate 9A, which connects input data line D to storage node S1 according to the level of clock signal CLK. Pass gate 9B selectively connects the output of inverter 8B to storage node S1. Pass gates 9A, 9B are each CMOS pass gates, constructed as a p-channel MOS transistor in parallel with an n-channel MOS transistor, with the gates of the two transistors receiving complementary versions of clock signal CLK (i.e., clock signal CLK itself and via inverter 11). In this example, pass gates 9A, 9B are complementary with one another, such that one is turned on when the other is turned off, and vice versa.

Inverter 8B is one of a pair of cross-coupled inverters providing the latch function in flip-flop 16, and receives storage node S2 at its input. The other inverter 8A in the cross-coupled pair has its input coupled to storage node 51, and drives storage node S2, completing the cross-coupling. In this case, the output of flip-flop 16 is taken on output data line Q from storage node S2, via inverter 14 (so that the output data level corresponds to that of input data line D). Bias to inverters 8A, 8B is provided from power supply node PWR by p-channel MOS transistor 13A and from ground by n-channel MOS transistor 13B. The gates of transistors 13A, 13B are driven by enable signal EN (inverted by inverter 19 in the case of transistor 13A).

Ferroelectric capacitors 15A, 15B, 17A, 17B in conventional flip-flop 16 provide the non-volatile retention of its state upon its power-down (e.g., enable signal EN driven inactive low). Similarly as in memory cell 10' of FIG. 2b, ferroelectric capacitors 15A, 17A are connected between storage node S1 and plate lines PL1, PL2, respectively; similarly, ferroelectric capacitors 15B, 17BA are connected between storage node S2 and plate lines PL1, PL2, respectively. Ferroelectric capacitors 17A, 17B are typically larger than ferroelectric capacitors 15A, 15B, and provide the voltage divider load for the recall or restore operation, as described above in connection with FIG. 2b. The operation of flip-flop 16 in programming its ferroelectric capacitors 15A, 15B, 17A, 17B with the current state of flip-flop 16 (i.e., storage nodes S1, S2), and in restoring that state on power-up, follows that described above relative to FIG. 2b.

Circuits such as memory cells 10, 10', and flip-flop 16, provide important non-volatile functionality in many modern integrated circuits. Non-volatile retention of memory contents, and logic states, as provided by these circuits enable the use of high-performance integrated circuit functionality in many applications previously thought to be impractical in the absence of non-volatile storage capability. However, ferroelectric elements such as capacitors are known to be vulnerable to later-life degradation due to various effects. Repeated read/write cycles (i.e., polarization and destructive read operations) can degrade the polarizability of ferroelectric capacitors, as can the effects of time and temperature.

For example, the mechanism of "imprint" is a well-known "end-of-life" mechanism that has been observed in ferroelectric devices. Imprint is exhibited by permanent shifts in the shape of the Q-V characteristic loop, generally appearing as flattened slopes in the transition curves and shifting in the polarization charge levels that result in an overall loss of area within the hysteresis loop. One type of imprint, referred to as "dynamic" imprint, results from repetitive or extended application of voltage exceeding one of the coercive voltages $V_\alpha$ or $V_\beta$, as the case may be, which effectively rewrites the same data in the cell. Imprint of the static type refers to permanent shifts in the polarization characteristic due to the capacitor remaining in one polarization state over time without external bias. FIG. 3 illustrates the effect of imprint on the Q-V characteristic of an example of a ferroelectric capacitor, by way of shifted characteristic curve 20 relative to its initial characteristic curve 22. In this somewhat extreme case, the effects of imprint include inadequate polarization of the capacitor in either state, as well as poorly defined coercive voltages.

As evident from FIG. 3, severe imprint greatly reduces the ability to distinguish the two polarization states from one another. In the context of memory cells 10, 10' and flip-flop 16 described above, in which the polarization states restore the previous circuit state according to capacitance differences between the polarization states, one can see that the capacitances $C(-1)$, $C(+1)$ indicated by the slopes of the Q/V transitions for the two polarization states from zero applied volts to a positive voltage are much closer to one another after the effects of imprint have set in (curve 20), than at time-zero (curve 22). Because the restore or recall operation relies on differences in capacitance between the two states, this weakness in polarization increases the likelihood that device imbalances, or noise events, can cause the memory cell or logic element incorporating ferroelectric capacitors to fall victim to a data error on restoring a programmed state. Certainly the likelihood of such errors increases as degradation of the ferroelectric material over time, temperature, and usage occurs. Such data errors have been observed in modern high-performance integrated circuits incorporating ferroelectric capacitors for non-volatile data and logic state retention.

It has been observed that any sizable population of ferroelectric capacitors will exhibit a distribution of polarization characteristics, and thus will include some ferroelectric capacitors that are "weaker" than others upon manufacture, in regard to the ability to electrically distinguish between their polarization states. Under the reasonable assumption that degradation of the polarization capability over time, temperature, and usage is uniform across the population of elements, those capacitors exhibiting the weaker polarization characteristic at time-zero will be the first to cause circuit failure in use. It would therefore be useful to perform a time-zero (i.e., at wafer level, or after packaging, or both) electrical test to screen out, from a population of manufactured integrated circuits, those devices that will be the earliest to fail within a particular threshold time.

Of course, in circuit implementations such as memory cells and logic circuits, it is difficult if not impossible to obtain a direct measurement of the polarization characteristics of each embedded ferroelectric capacitor. Rather, the polarization behavior of these elements can only be interrogated in an indirect manner. In the case of memory cells such as those described above in connection with FIGS. 2a and 2b, one conventional screening approach is to reduce the power supply ($V_{dd}$) bias applied to the memory cells 10, 10' when performing a restore operation. This reduced power supply bias will be reflected in weaker distinction in the voltages presented by the ferroelectric capacitors to the storage nodes during the restore operation. However, it has been observed that there is a poor correlation between those devices failing such a reduced $V_{dd}$ storage test, and those devices that exhibit the weakest reliability due to time-dependent polarization degradation, especially as reliability requirements continue to become more stringent.

Another conventional approach to time-zero screening of non-volatile latches in memory cells is to apply a small disturb differential voltage from the bit lines to the storage nodes, prior to performing a restore or recall operation. That approach is somewhat cumbersome insofar as construction of write circuits in the memories is concerned. In addition, this bit line disturb voltage approach is not applicable to logic circuits such as flip-flop 16 that do not have accessible "bit lines" at all, especially for such circuits that are embedded in complex logic chains and data paths.

By way of further background, copending and commonly assigned U.S. patent application Ser. No. 12/142,568, published as U.S. Patent Application Publication No. US 2009/0316469 A1, incorporated herein by reference, describes a test procedure for screening weak ferroelectric capacitors in a non-volatile memory, using a short high temperature bake.

BRIEF SUMMARY OF THE INVENTION

Embodiments of this invention provide a method and circuit in which non-volatile circuits including ferroelectric capacitors can be accurately and efficiently screened, upon manufacture, for the effects of polarization degradation over time and usage.

Embodiments of this invention also provide such a method and circuit that is suitable for non-volatile memory cells.

Embodiments of this invention also provide such a method and circuit that is suitable for non-volatile logic elements and circuits.

Embodiments of this invention also provide such a method and circuit that accurately reflects the behavior of the circuits incorporating the ferroelectric elements, such that the effect of device imbalances in those circuits is reflected in the time-zero screen.

Embodiments of this invention also provide such a method and circuit that enables characterization of populations of circuits including the ferroelectric elements.

Other objects and advantages of this invention will be apparent to those of ordinary skill in the art having reference to the following specification together with its drawings.

Embodiments of this invention may be implemented into a logic or memory circuit having a latch circuit with two storage nodes, in which ferroelectric capacitors are coupled to each of the storage nodes. Separate plate lines are connected to corresponding ferroelectric capacitors at the two storage nodes. Testing of the stability of the circuit is carried out by performing a restore operation with a reduced voltage, on one of the two plate lines relative to the other plate line, so as to reduce the differential voltage developed in the restore operation at the two storage nodes. Determination of whether the circuit satisfies a margin test is based on whether the latch circuit is restored to the previous state.

According to another aspect of the invention, embodiments of the invention may be implemented in a method of developing a time-zero screen for devices of poor margin. Non-volatile circuits in a population are characterized to determine their stability margin at time zero, by evaluating the reduced voltage applied to its two plate lines, connected to corresponding ferroelectric capacitors at the two storage nodes, causing a restore error. The circuits in the population are then subjected to accelerated stress, for example a bake operation, and are then tested to evaluate restore capability. A reduced voltage level is then selected from the results of the testing operation, and used in screening manufactured circuits to remove potential reliability risks.

BRIEF DESCRIPTION OF THE SEVERAL VIEWS OF THE DRAWING

FIGS. 6a and 6b are flow diagrams illustrating methods of performing electrical tests of non-volatile memory and logic circuits according to embodiments of this invention.

FIG. 8 is a flow diagram illustrating a method of performing a time-zero bake test for screening weak capacitors, according to an embodiment of the invention.

DETAILED DESCRIPTION OF THE INVENTION

This invention will be described in connection with certain of its embodiments, namely as implemented into non-volatile latch circuits implemented into memory resources in the form of static random access memory (SRAM) or as bistable multivibrators (flip-flops), because it is contemplated that this invention is especially beneficial when applied to such circuits. However, it is also contemplated that other logic and memory circuits may also greatly benefit from this invention. Accordingly, it is to be understood that the following description is provided by way of example only, and is not intended to limit the true scope of this invention as claimed.

As mentioned above, this invention is suitable for use in connection with semiconductor memory circuits, whether serving as a stand-alone integrated circuit or as embedded into larger scale integrated circuits such as microprocessors, microcontrollers, or the so-called "system on a chip" (SoC) integrated circuits. This invention is also suitable for use in logic circuits, including combinational and sequential logic circuits, as well as programmable logic circuits. Examples of embodiments of this invention in memory and logic circuits will be described in this specification, it being understood that such descriptions of implementations of this invention are not to be interpreted in a limiting fashion.

Figure 4A:
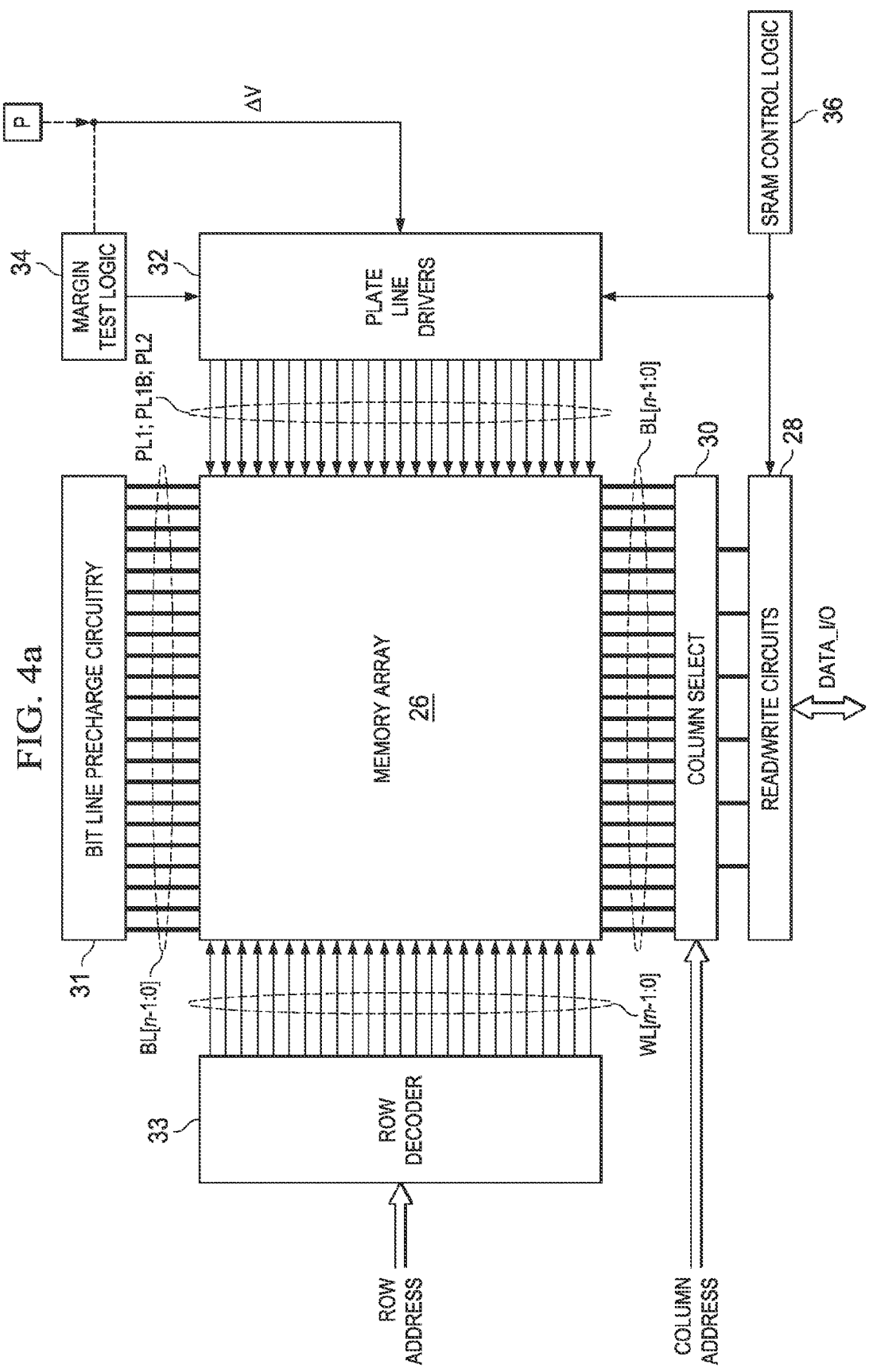
FIG. 4a is an electrical diagram, in block form, of a memory constructed according to embodiments of this invention.

FIG. 4a shows an example of a static random access memory (SRAM) implementing an embodiment of this invention. Memory array 26 includes non-volatile SRAM memory cells arranged in m rows and n columns, with memory cells in the same column sharing a pair of bit lines BL[n-1:0], and with memory cells in the same row sharing one of word lines WL[m-1:0]. Row decoder 33 receives a row address value indicating the row of memory array block 26 to be accessed, and energizes the one of word lines WL[m-1:0] corresponding to that row address value. Column select circuit 30 receives a column address value, and in response selects one or more pairs of bit lines BL[n-1:0] for connection to read/write circuits 28, which may be realized as conventional sense amplifiers and write circuits as known in the art for SRAM devices. Read/write circuits 28 are coupled to bus DATA_I/O, by way of which output data and input data are communicated from and to read/write circuits 28 and thus the addressed memory cells within memory array 26, in the conventional manner. Bit line precharge circuitry 31 is provided to apply a desired precharge voltage to the pairs of bit lines BL[n-1:0] in advance of read and write operations, and during standby periods. Of course, many variations in the particular memory arrangement can be realized within this architecture, and by way of variations to this architecture, in connection with this embodiment of the invention.

As will be described in further detail below, the memory cells within memory array 26 have non-volatile capability provided by ferroelectric capacitors that can be polarized to retain the current state of corresponding memory cells. In this regard, the memory of FIG. 4*a* also includes plate line drivers 32, which drive plate line conductors connected to ferroelectric capacitors in memory cells of memory array 26. According to embodiments of this invention, those plate lines include at least two plate lines PL1, PLB, and also possibly a third plate line PL2 for those memory cells including four ferroelectric capacitors. Typically, these plate lines PL1, PL1B, PL2 are common for all memory cells in memory array 26 that include ferroelectric capacitors; alternatively, these plate lines PL1, PL1B, PL2 may be dedicated to groups of one or more rows, in similar manner as word lines WL[m-1:0], and thus selectively energized based on the row address. Plate line drivers 32, as well as read/write circuits 28 and other circuitry within the memory, are also controlled by SRAM control logic 36, which refers generally to logic circuitry that controls the operation of plate line drivers 32, bit line precharge circuitry 31, and read/write circuits 28, in response to clock signals and control signals (not shown).

According to this embodiment of the invention, the memory of FIG. 4*a* also includes margin test logic 34, which receives control signals (not shown) or other inputs indicating that a stability margin test is to be performed according to embodiments of this invention. To carry out such a test, as will be described below, margin test logic 34 generates the appropriate signal to plate line drivers 32 to control the manner in which plate line voltages are applied to plate lines PL1, PL1B, PL2, in combination with a difference voltage signal ΔV that is either generated by margin test logic 34 itself or that is received from an external pad P or other location within the integrated circuit. The operation of plate line drivers 32 in carrying out such a test will be described in further detail below.

It is contemplated that margin test logic 34, and particularly external pad P, may be accessible or operable only during the manufacture of integrated circuits including the functionality of embodiments of this invention, but not necessarily after the integrated circuits are packaged, or deployed into system applications. For example, external pad P may not be "bonded out" when the integrated circuits are separated from wafer form and mounted into the eventual package, but may be accessible only during functional testing of the circuit in wafer form. Similarly, margin test logic 34 may be electrically disabled or otherwise inaccessible in the integrated circuit once packaged or upon completion of manufacture. In these cases, once margin test logic 34 is disabled in this manner, plate lines PL1, PL1B would effectively be in common, and driven by plate line drivers 32 to the same voltage at all times, eliminating the possibility that normal operation is disrupted by the margin test functionality.

Figure 1:
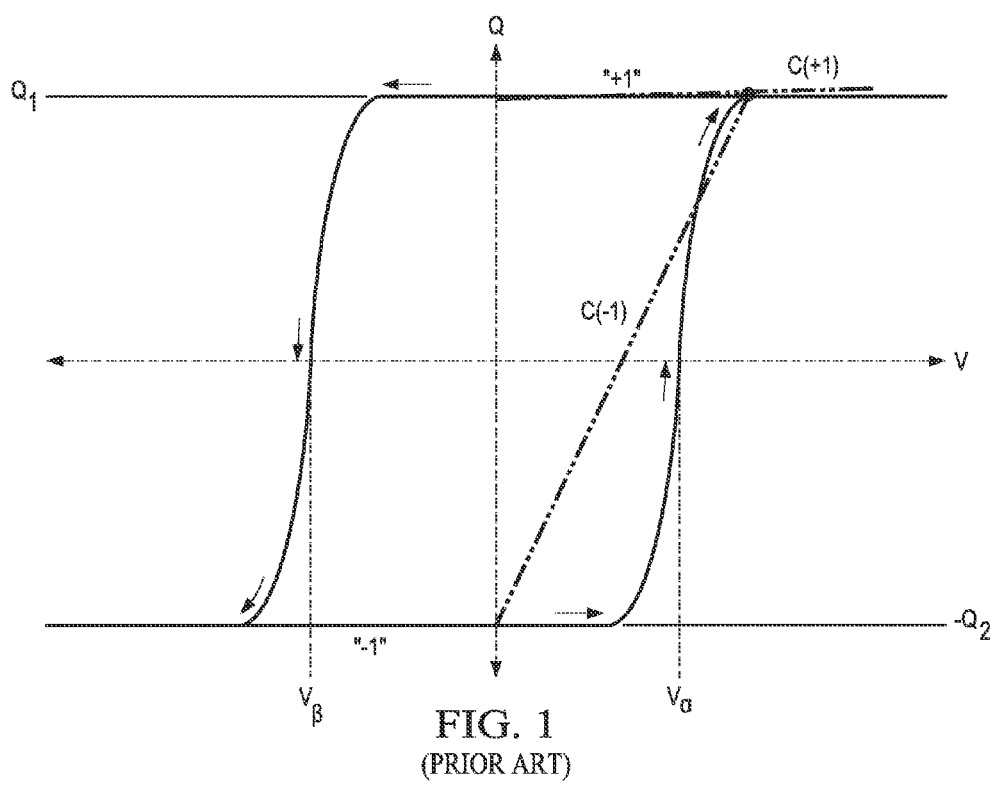
FIG. 1 is a plot of a charge-vs.-voltage characteristic of a conventional ferroelectric capacitor.
Figure 2A:
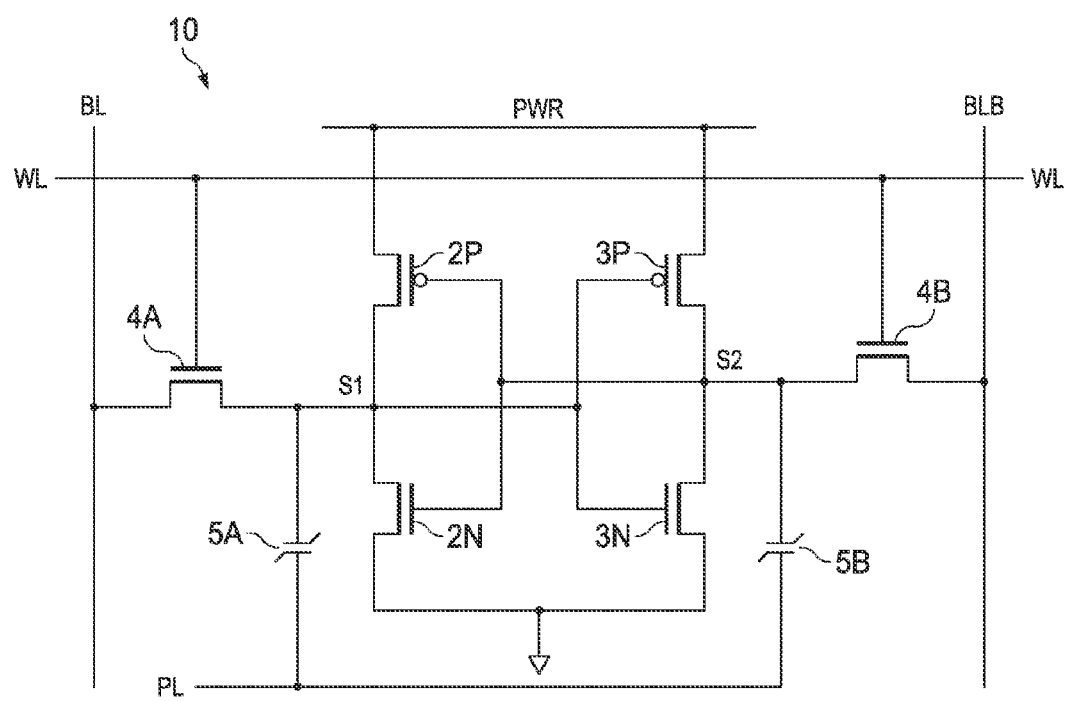
FIGS. 2a and 2b are electrical diagrams, in schematic form, of conventional non-volatile static random access memory (SRAM) cells.
Figure 2B:
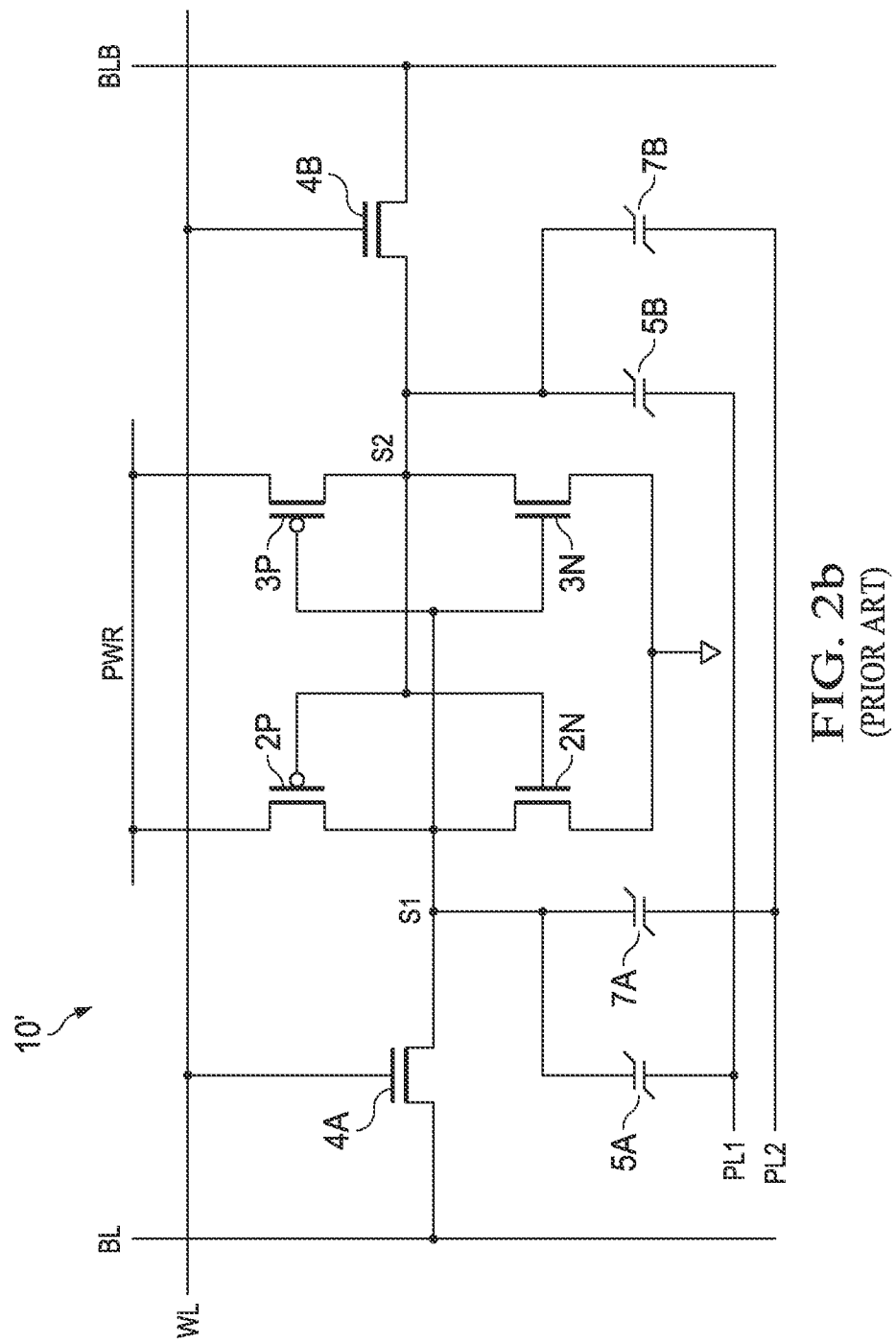
Figure 2C:
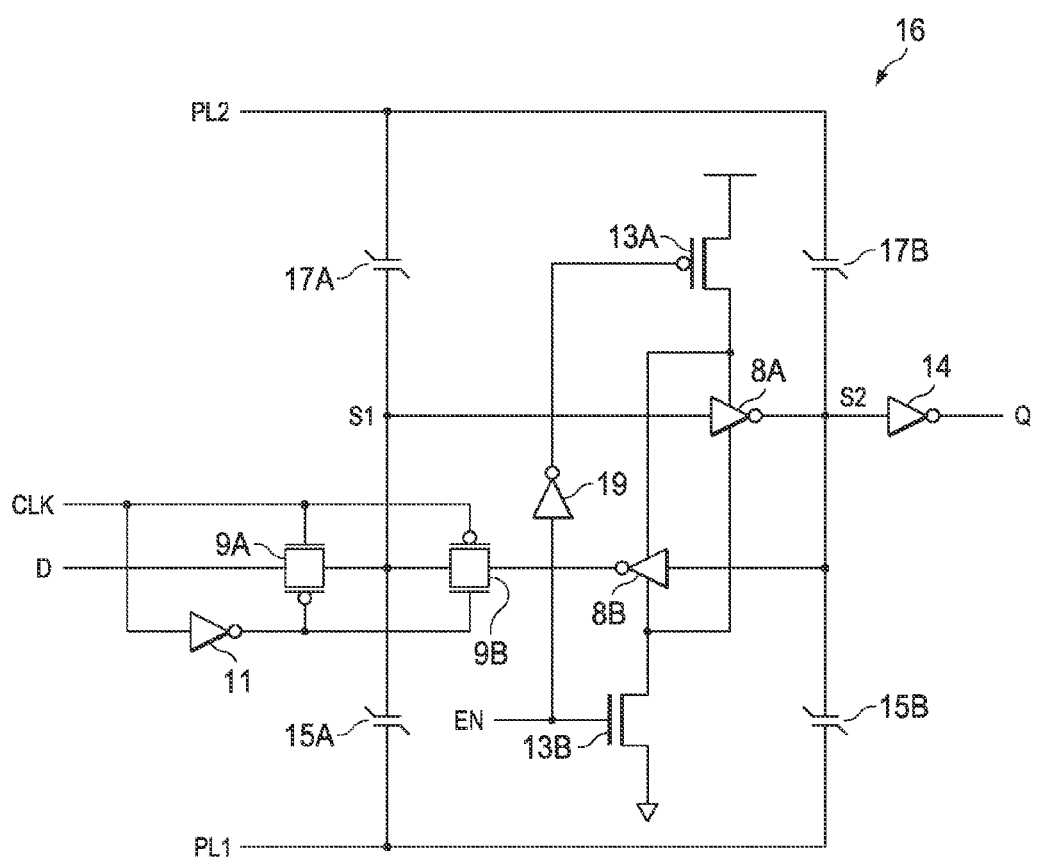
FIG. 2c is an electrical diagram, in schematic form, of a conventional non-volatile flip-flop logic circuit.
Figure 3:
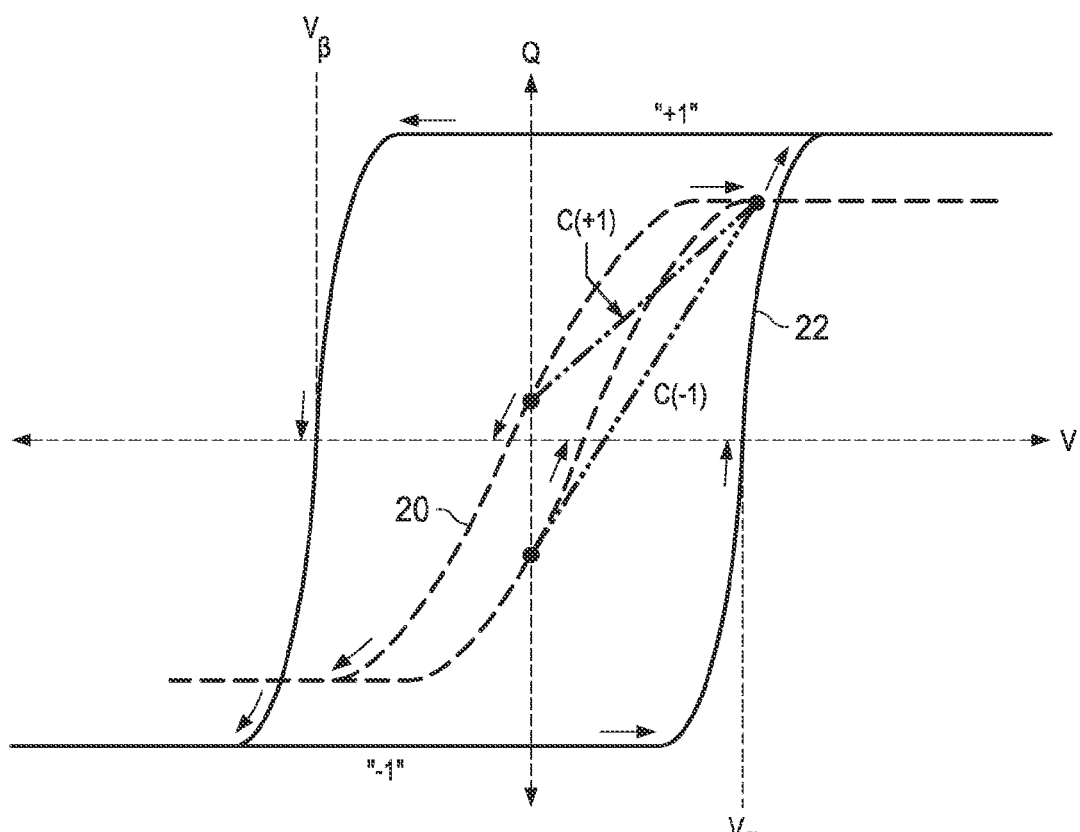
FIG. 3 is a plot of the polarization characteristic of a ferroelectric capacitor illustrating the effects of imprint.
Figure 4B:
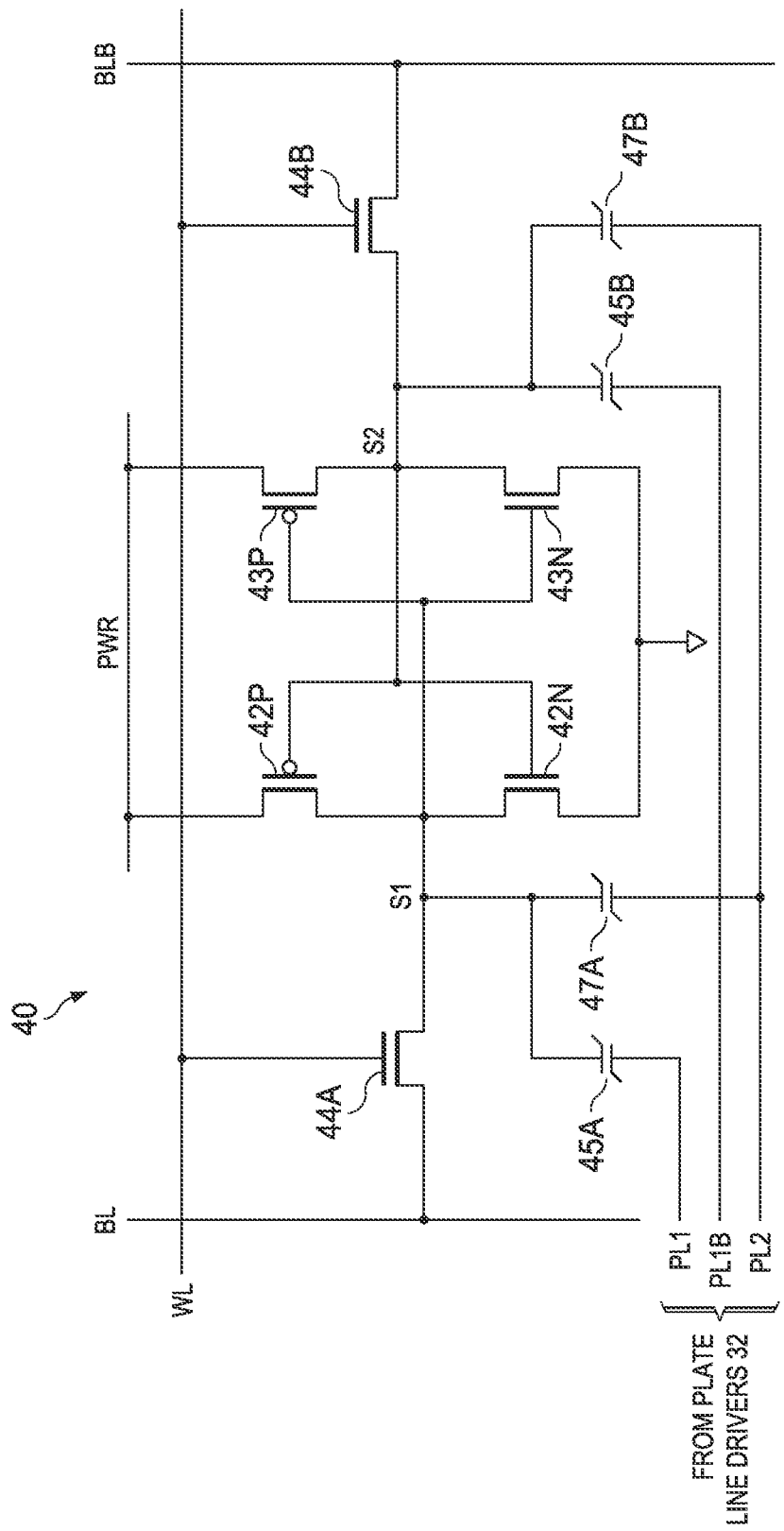
FIGS. 4b through 4d are electrical diagrams, in schematic form, of memory cells constructed according to embodiments of this invention.

FIG. 4*b* illustrates the construction of an example of non-volatile memory cell 40 in memory array 26, according to an embodiment of the invention. Memory cell 40 is constructed similarly to conventional cell 10' described above in connection with FIG. 2*b*, and is thus based on cross-coupled CMOS inverters forming a latch, with the stored contents present as complementary logic levels at storage nodes S1, S2. Storage node S1 is driven at the common drain node of p-channel MOS transistor 42P and n-channel MOS transistor 42N, which have their source-drain paths connected in series between power supply node PWR and ground, and their gates connected in common to storage node S2. The other inverter in the cross-coupled pair is formed of p-channel MOS transistor 43P and n-channel MOS transistor 43N, with their source-drain paths also connected in series between power supply node PWR and ground, driving storage node S2 at their common drain node and receiving storage node S1 at their gates. N-channel MOS pass transistor 44A has its source-drain path connected between storage node S1 and bit line BL, and its gate connected to word line WL; similarly, n-channel MOS pass transistor 44B has its source-drain path connected between storage node S2 and bit line BLB, and its gate also connected to word line WL.

Non-volatile storage of the state of memory cell 40 is provided by ferroelectric capacitors 45A, 47A, 45B, 47B. Each of ferroelectric capacitors 45A, 47A, 45B, 47B is constructed as conventional parallel plate ferroelectric capacitors, for example having conductive capacitor plates formed of a metal such as aluminum or tungsten, with a capacitor dielectric formed of a ferroelectric material such as PZT. As is typical in modern integrated circuit process technology, ferroelectric capacitors 45A, 45B, 47A, 47B can be formed in a manner consistent with CMOS technology, for example as metal-to-metal capacitors formed between metal levels overlying the transistor level of the integrated circuit structure of memory array 26. Capacitors 45A, 47A each have one plate connected to storage node S1, while capacitors 45B, 47B each have one plate connected to storage node S2.

Ferroelectric capacitors 47A, 47B are preferably larger in capacitor area (and thus larger in linear capacitance) than capacitors 45A, 45B, and are connected between their respective storage nodes S1, S2, and plate line PL2. According to this embodiment of the invention, ferroelectric capacitor 45A is connected between storage node S1 and plate line PL1, while ferroelectric capacitor 45B is connected between storage node S2 and plate line PL1B. Each of plate lines PL1, PL1B, and PL2 are driven by plate line drivers 32, under the control of SRAM control logic 36 and margin test logic 34, as shown in FIG. 4*a*. This separation of plate lines PL1, PL1B is used in stability margin testing of memory cell 40, as will be described in detail below. Alternatively, ferroelectric capacitors 45A, 45B can be connected between their respective storage nodes S1, S2 and a single plate line conductor, in which case the plate line conductor (i.e., plate line PL2) is split into two separate conductors connected to respective ones of capacitors 47A, 47B.

In the normal operation of memory cell 40 (i.e., outside of the special test operation for stability margin), plate lines PL1, PL1B receive the same voltage at the same points in time. During such normal operation, memory cell 40 operates in similar manner as a volatile CMOS SRAM memory cell. Plate lines PL1, PL1B, PL2 are held at ground or at an intermediate voltage (e.g., $V_{dd}/2$) during normal SRAM read, write, and standby, so that no polarization occurs during normal SRAM operation.

In normal operation as an SRAM, for the example of memory cell 40, during standby periods in which no memory cell in memory array 26 is being accessed, word line WL will be maintained at an inactive low level, turning off pass transistors 44A, 44B and thus isolating storage nodes S1, S2 from bit lines BL, BLB. Bit lines BL, BLB can be precharged, for example to power supply voltage $V_{dd}$, by precharge circuitry 31 during this standby period. A read of memory cell 40 during normal SRAM operation is carried out by word line drivers 33 energizing word line WL for the row of memory cells 40 indicated by the row address, which turns on pass transistors 44A, 44B, connecting storage nodes S1, S2 to bit lines BL, BLB, respectively. In this example, in which bit lines BL, BLB are precharged high (e.g., $V_{dd}$), the one of storage nodes S1, S2 at a low logic level will discharge its associated bit line BL, BLB toward ground (through operation of its driver transistor 42N, 43N). This discharging establishes a differential voltage across bit lines BL, BLB that, for selected columns, will be sensed by a conventional sense amplifier in read/write circuits 28. Bit lines BL, BLB are precharged high in advance of an SRAM write operation, followed by read/write circuitry 28 driving a low logic level onto the one of bit lines BL, BLB for a selected column, according to the desired data states to be written. Upon word line WL turning on pass transistors 44A, 44B for memory cells 40 in selected rows, the differential levels at bit lines BL, BLB are communicated to storage nodes S1, S2 in those cells 40, causing the cross-coupled inverters of memory cell 40 to latch the communicated state at their storage nodes S1, S2. The write is completed upon word line driver 33 drives word line WL low, following which storage nodes S1, L2 maintain the written logic state so long as cell 40 is powered-up. SRAM read, write, and standby operations for memory cell 40 thus follow that of conventional volatile CMOS SRAMs.

The non-volatile operation of memory cell 40 of FIG. 4b, in its normal operation, follows that described in Masui et al., "Design and Applications of Ferroelectric Nonvolatile SRAM and Flip-Flop with Unlimited Read/Program Cycles and Stable Recall", *Proceedings of the Custom Integrated Circuits Conference*, Paper 16-6-1 (IEEE, 2003), pp. 403-406; and in Masui et al., "A Ferroelectric Memory-Based Secure Dynamically Programmable Gate Array", *J. Solid State Circuits*, Vol. 38, No. 5 (IEEE, May 2003), pp. 715-725; both incorporated herein by reference; and as described above in connection with conventional memory cell 10' of FIG. 2b. In this normal mode non-volatile operation, plate lines PL1, PL1B are at the same voltage as one another at all times, essentially operating as a single plate line despite being carried on separate conductors to capacitors 45A, 45B.

To summarize, the current SRAM logic state at storage nodes S1, S2 is programmed into ferroelectric capacitors 45A, 45B, 47A, 47B of memory cell 40 by the operation of plate line drivers 33. The programming operation is carried out by plate line drivers 33 driving plate lines PL1, PL1B PL2 to a high voltage (e.g., $V_{dd}$) for a selected duration, and then to a low voltage (e.g., ground) for a selected duration, while memory cell 40 remains powered up. Word line WL is maintained at a low logic level during this programming operation, isolating storage nodes S1, S2 from bit lines BL, BLB so that the bit line voltages do not load the programming operation. The resulting polarization states of capacitors 45A, 47A, 45B, 47B are determined by the logic states at storage nodes S1, S2. In this case, capacitors 45A, 47A are polarized to one state, while capacitors 45B, 47B are polarized to the other state. Memory cell 40 can then be powered down, because ferroelectric capacitors 45A, 45B, 47A, 47B are now retaining the programmed data state.

To recall the programmed state of memory cell 40 upon powering-up of memory cell 40, plate lines PL1, PL1B PL2 are initially maintained at a low voltage (e.g., ground). Plate lines PL1, PL1B are together then driven to a high voltage (e.g., $V_{dd}$) while plate line PL2 remains at a low voltage. Bias is then applied to memory cell 40 at power supply node PWR; word line WL is maintained at an inactive low level, maintaining pass transistors 44A, 44B off. With plate lines PL1, PL1B at power supply voltage PWR and plate line PL2 at ground, the voltages at storage nodes S1, S2 are established according to a capacitor voltage divider arrangement. Voltage $V_{S1}$ at storage node S1 is defined as:

$$V_{S1} = V_{dd}\left(\frac{C_{45A}}{C_{45A} + C_{47A}}\right)$$

and voltage $V_{S2}$ at storage node S2 is defined as:

$$V_{S2} = V_{dd}\left(\frac{C_{45B}}{C_{45B} + C_{47B}}\right)$$

However, the capacitances of ferroelectric capacitors 45A, 47A, 45B, 47B vary from one another according to their polarization states from the programming operation, and this difference determines the data state to be restored to memory cell 40. For example, if the programmed state is based on storage node S1 at a high logic level and storage node S2 at a low logic level, ferroelectric capacitors 45A, 47A are polarized to the "−1" state, and ferroelectric capacitors 45B, 47B are polarized to the "+1" state. In the recall operation, with plate lines PL1, PL1B at $V_{dd}$ and plate line PL2 at ground, the effective capacitance $C_{45A}$ of ferroelectric capacitor 45A is higher than capacitance $C_{47A}$, because of the polarization charge from capacitor 45A as it changes polarization state from "−1" to "+1" in response to the $V_{dd}$ voltage at plate lines PL1, PL1B. The apparent capacitances $C_{47A}$, $C_{47B}$ are dominated by the linear capacitance component of capacitors 47A, 47B, because the reduced voltage across these elements is generally not effective to repolarize these capacitors, and also because of their relatively large size as compared with capacitors 45A, 45B. The resulting voltage $V_{S1}$ at storage node S1 is therefore higher than the voltage $V_{S2}$ at storage node S2 by an amount:

$$V_{S1} - V_{S2} = V_{dd}\left(\frac{C_{45A}}{C_{45A} + C_{47A}}\right) - V_{dd}\left(\frac{C_{45B}}{C_{45B} + C_{47B}}\right)$$

because $C_{45A} > C_{47A}$ in this example. In one example of memory cell 40, the lower of the two voltages ($V_{S2}$ in this example) will be at about $V_{dd}/4$, and the higher of the two voltages ($V_{S1}$ in this example) will be at about $V_{dd}/2$. Conversely, of course, if the opposite state of memory cell 40 were programmed into ferroelectric capacitors 45A, 47A, 45B, 47B, then on recall the voltage $V_{S2}$ at storage node S2 would be higher than the voltage $V_{S1}$ at storage node S1 by a similar amount. In either case, the differential voltage at storage nodes S1, S2 established by the recall pulse on plate lines PL1, PL1B is then latched into memory cell 40 as power supply voltage $V_{dd}$ is applied to power supply node PWR. Plate lines PL1, PL1B then return to ground for normal SRAM operation.

According to this embodiment of the invention, the separate plate lines PL1, PL1B enable the direct characterization and testing of the stability margin of memory cell 40. In a general sense, a differential voltage is applied by plate line drivers 33 to plate lines PL1, PL1B, in a direction that "disturbs" the recall operation of memory cell 40. This "disturb" results from applying a lower plate line voltage to the stronger side (i.e., at a "1" state) of the latch than that applied to the weaker side (at the "0" state). Depending on imbalances in memory cell 40 itself as well as the strength of the polarization characteristic of ferroelectric capacitors 45A, 47A, 45B, 47B, the magnitude of this disturb differential voltage required to cause memory cell 40 to recall an incorrect data state is a measure of the stability margin of memory cell 40, and thus is a measure of the long-term reliability of memory cell 40 from the standpoint of its non-volatile data storage.

As described above, in the recall operation, the voltages at storage nodes S1, S2 are established by voltage dividers of ferroelectric capacitors 45A, 47A, 45B, 47B, from the voltages applied to plate lines PL1, PL1B. In the normal operation recall described above, power supply voltage $V_{dd}$ is applied to both of plate lines PL1, PL1B. In the stability margin test according to this embodiment of the invention, the voltage $V_{PL1}$ applied to plate line PL1 in recall differs from the voltage $V_{PL1B}$ at plate line PL1B, and those different plate line voltages will be reflected in the storage node voltages:

$$V_{S1} = V_{PL1}\left(\frac{C_{45A}}{C_{45A} + C_{47A}}\right)$$

$$V_{S2} = V_{PL1B}\left(\frac{C_{45B}}{C_{45B} + C_{47B}}\right)$$

with the difference (for the case in which $V_{S1} > V_{S2}$):

$$V_{S1} - V_{S2} = V_{PL1}\left(\frac{C_{45A}}{C_{45A} + C_{47A}}\right) - V_{PL1B}\left(\frac{C_{45B}}{C_{45B} + C_{47B}}\right)$$

for the case in which plate line PL2 is at ground. Accordingly, by reducing the plate line voltage applied to the ferroelectric capacitor 45 associated with the storage node at the "1" logic level in the programming operation, the difference voltage established at storage nodes S1, S2 in the recall operation is reduced. One could instead increase the plate line voltage applied to the capacitor 45 associated with the "0" level storage node to decrease the recall voltage differential. In either case, it has been observed that this reduction in differential voltage at the storage nodes in a recall operation mimics the effect of long-term degradation of ferroelectric capacitors. In addition, by applying this reduced difference voltage in a recall operation for memory cell 40, device imbalances in memory cell 40 or its associated elements will also be reflected in the ability of memory cell 40 to tolerate such degradation.

Alternatively, separate plate lines PL2, PL2B may be used to apply different "ground" voltages to ferroelectric capacitors 47A, 47B in carrying out a stability margin test. If separate ground plate lines PL2, PL2B are connected to capacitors 47A, 47B, respectively, with a single plate line PL1 connected to capacitors 45A, 45B, the storage node voltages $V_{S1}$, $V_{S2}$ would be defined as:

$$V_{S1} = (V_{PL1} - V_{PL2})\left(\frac{C_{45A}}{C_{45A} + C_{47A}}\right)$$

$$V_{S2} = (V_{PL1} - V_{PL2B})\left(\frac{C_{45B}}{C_{45B} + C_{47B}}\right)$$

In this case, a higher voltage at plate line PL2B than at plate line PL2 (e.g., at ground) would reduce the voltage difference $V_{S1} - V_{S2}$ for the case in which a "1" state at storage node S1 is being recalled; conversely, to test the margin in recalling a "1" state at storage node S2, plate line PL2 would receive a slightly higher voltage than plate line PL2B (which may be at ground). To summarize:

| Logic state | PWR | BL; BLB | WL | PL1 | PL1B | PL2 |
|---|---|---|---|---|---|---|
| S1 = 1; S2 = 0 | off → on | precharged | off | $V_{dd} - \Delta V$ | $V_{dd}$ | 0 v |
| S1 = 0; S2 = 1 | off → on | precharged | off | $V_{dd}$ | $V_{dd} - \Delta V$ | 0 v |

According to embodiments of this invention, in a special test mode, margin test logic 34 will issue control signals to plate line drivers 32 to establish a voltage difference between plate lines PL1, PL1B to be driven in the stability margin test. The special test mode may be invoked by external control signals applied to the memory, for example by way of a test pad or by applying a programmed control state. The control signals issued by margin test logic 34 instruct plate line drivers 32 to drive different voltages on plate lines PL1, PL1B of a certain magnitude and polarity. The magnitude of the voltage difference can be defined at special test pad P, particularly if the memory is being tested in wafer form (i.e., a special electrical probe can contact pad P), and communicated to plate line drivers 32 on control line ΔP. Alternatively, margin test logic 34 can itself define the magnitude of the voltage difference and communicate that magnitude to plate line drivers 32 on control line ΔP. Further in the alternative, a Built-In-Self-Test (BIST) function can be realized on-chip to automate the execution of this margin test. Control line ΔP can directly carry an analog voltage at the reduced voltage to be driven onto the lower one of plate lines PL1, PL1B; may carry an analog voltage at the voltage difference between plate lines PL1, PL1B to be driven; may carry an analog or digital control value from which plate line drivers 32 derive the lower voltage or the voltage difference; or may carry a reference gate voltage that controls a device in plate line drivers 32 that defines the voltage drop from power supply voltage $V_{dd}$ to the lower plate line voltage; or some other signal or voltage level defining this voltage difference. The polarity of the voltage difference on plate lines PL1, PLB in a margin test depends on the data state programmed into ferroelectric capacitors 45A, 45B, 47A, 47B, as described above, and will also be communicated by margin test logic 34.

As mentioned above, the stability margin of the non-volatile functionality of memory cell 40 according to this embodiment of the invention can be tested by applying a reduced plate line voltage to the ferroelectric capacitor 45A, 45B associated with the storage node S1, S2 at which the "1" logic level is to be restored. The conditions for this test can be summarized as: where the voltage ΔV corresponds to the voltage or voltage differential indicated at special pad P or by margin test logic 34, as the case may be, as described above.

Referring now to FIG. 6a, a method of carrying out a stability margin test according to an embodiment of the invention, on a memory including memory cells 40 with separate plate lines PL1, PL1B as described above, will now be described. This implementation is described by way of example only, it being understood that variations to the specific sequence and method of this margin test will be apparent to those skilled in the art having reference to this specification, and that such variations and alternatives are within the scope of the invention as claimed.

Stability margin test 80 begins with process 84, in which a first data state is written to the latches in memory cells 40 to be tested, with word line WL activated to turn on pass gates 44A, 44B, and bit line BLB pulled low to write a "1" state to storage node S1 of each memory cell 40 under test. Write process 84 will be repeated for each memory cell 40 being tested in this pass of margin test 80, ranging from a single memory cell 40 to all memory cells 40 in the memory. In process 86, this current data state (storage node S1="1") is programmed into ferroelectric capacitors 45A, 45B, 47A, 47B for memory cells 40 under test, by pulsing plate lines PL1, PL1B, PL2 in the manner described above. Memory cells 40 under test are then powered-down by power supply node PWR being taken to ground or otherwise isolated from the $V_{dd}$ power supply (e.g., by powering down the entire memory).

In process 90, the programmed data state is then recalled into memory cells 40 under test, but including a disturb voltage as described above. For the current programmed data state, process 90 applies a voltage at plate line PL1 that is reduced, relative to plate line PL1B, by a difference indicated by the voltage $\Delta V$ at special pad P or by margin test logic 34. As described above, this differential plate line bias reduces the voltage differential developed at storage nodes S1, S2 for the "1" data state being recalled. The memory cells 40 under test are then powered-up in process 92, by power supply node PWR being pulled to power supply $V_{dd}$, causing the cross-coupled inverters to latch the state determined by the voltages at storage nodes S1, S2. In process 94, memory cells 40 under test are then read in the conventional manner, typically by sequencing through the corresponding addresses. Read process 94 determines whether the original data state (storage node S1="1") was correctly recalled for each of memory cells 40 under test, despite the disturb voltage applied in the recall operation of process 90. For those memory cells 40 that do not return the correct data state, the stability margin is below that corresponding to the voltage difference $\Delta V$.

According to this embodiment of the invention, margin test 80 continues with the testing of each of memory cells 40 under test for the opposite data state. Process 96 writes each of memory cells 40 under test with a data state corresponding to storage node S1 at a "0" logic level. Ferroelectric capacitors 45A, 45B, 47A, 47B are then programmed to that data state in process 98, and memory cells 40 are powered down in process 100. In process 102, a disturbed recall operation is performed by plate line drivers 32 applying a reduced voltage at plate line PL1B relative to that applied to plate line PL1, as indicated by the voltage $\Delta V$ at special pad P or by margin test logic 34. This differential plate line bias reduces the voltage differential that would otherwise be developed at storage nodes S1, S2 for the data state of storage node S1="0". Memory cells 40 under test are then powered-up in process 104, and their recalled data states read in the conventional manner in process 106. As in the case of the "1" data state, those memory cells 40 that do not return a "0" data state in read process 106 have a stability margin below that corresponding to the voltage difference $\Delta V$ applied in process 102.

Figure 4C:
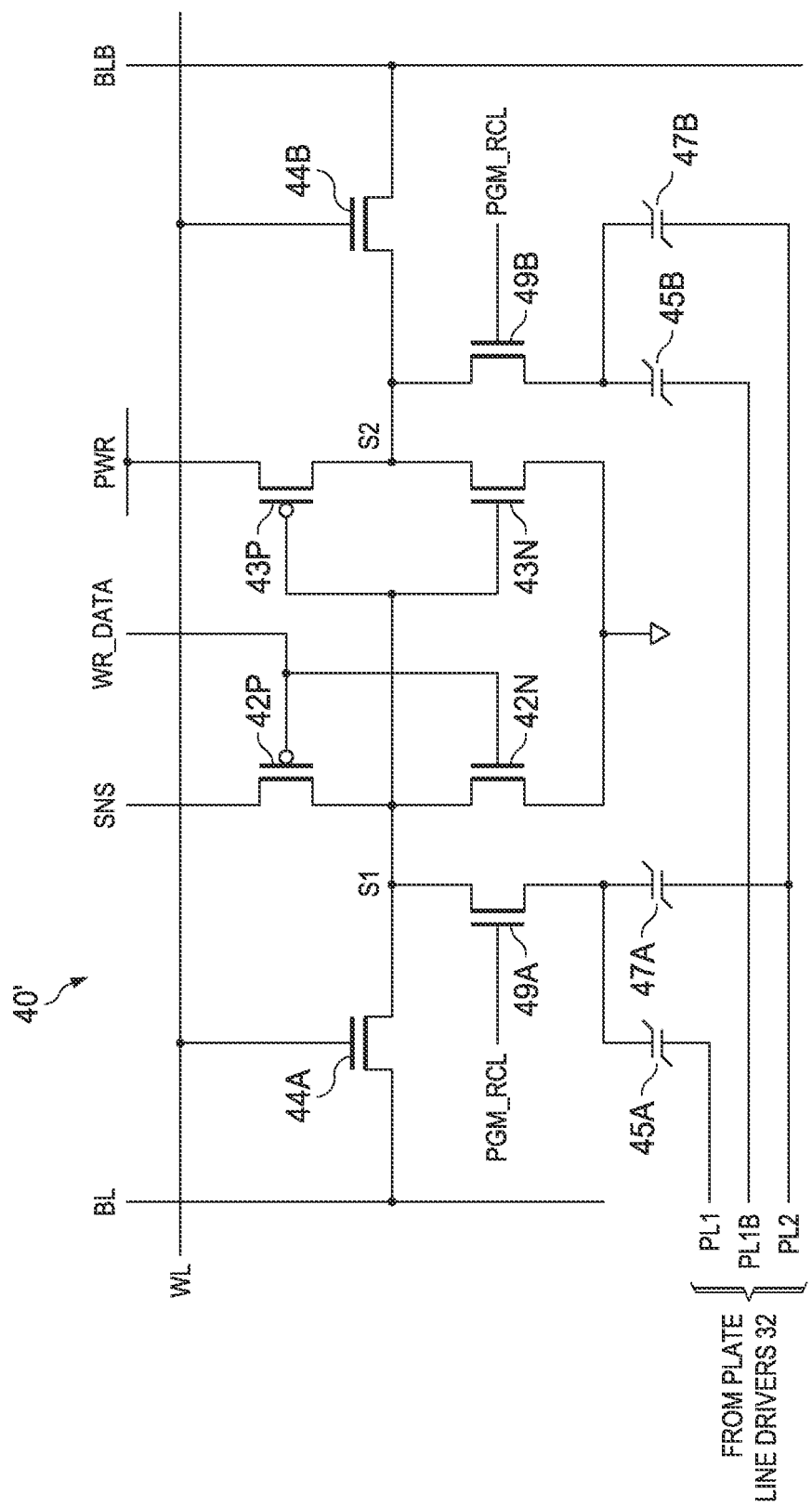

This approach to stability margin tests, according to this invention, can be applied to memory cells 40 of alternative construction, an example of which is shown in FIG. 4c by way of memory cell 40'. According to this alternative construction, memory cell 40' includes a separate sense line SNS and a separate write line WR_DATA. Sense line SNS is connected to the source of p-channel transistor 42P in one of the inverters of memory cell 40', and effectively serves as the power supply for the inverter of transistors 42P, 42N. Write line WR_DATA is connected to the gates of transistors 42P, 42N, and sets the state of storage node S1 of cell 40' (with sense line SNS biased toward $V_{dd}$). The gates of transistors 43P, 43N in the other inverter are coupled to storage node S1, and their common drain node drives storage node S2; in this cell 40', the gates of transistors 42P, 42N are not coupled to storage node S2. In operation, the state of memory cell 40' is written by the write line WR_DATA, with the written state propagating (in its complement) to storage node S2.

Another alternative aspect to the construction of cell 40' includes isolation transistors 49A, 49B as shown in FIG. 4c. In cell 40 of FIG. 4b, substantial linear capacitance presented by ferroelectric capacitors 45A, 45B, 47A, 47B to storage nodes S1, S2, which slows the switching speed of those nodes. This capacitive loading is reduced in memory cell 40' of FIG. 4c by isolation transistors 49A, 49B, which are re-channel MOS transistors; alternatively, these devices may be implemented as p-channel transistors, depending on layout and other considerations. Transistor 49A has its source-drain path connected between storage node S1 and ferroelectric capacitors 45A, 47A; and transistor 49B has its source-drain path connected between storage node S1 and ferroelectric capacitors 45B, 47B. The gates of transistors 49A, 49B receive control signal PGM_RST from SRAM control logic 36. During normal SRAM operations (read, write, standby), control signal PGM_RST is driven inactive low, turning off transistors 49A, 49B and isolating ferroelectric capacitors 45A, 45B, 47A, 47B from storage nodes S1, S2, eliminating the capacitive loading on those nodes and thus improving the latching performance of memory cell 40' from that of memory cell 40 of FIG. 4b. During program and recall operations involving ferroelectric capacitors 45A, 45B, 47A, 47B, SRAM control logic 36 drives control signal PGM_RST active, connecting ferroelectric capacitors 45A, 45B, 47A, 47B to their respective storage nodes S1, S2.

While memory cell 40' shows the alternative feature of separate sense and write lines SNS, WR_DATA, in combination with isolation transistors 49A, 49B, it is of course understood that these alternative features are independent of one another, and as such either feature may be used in a particular realization of non-volatile memory cells according to embodiments of this invention. In any case, the stability margin test described above in connection with memory cell 40 and FIG. 6a may be applied in the same manner to memory cell 40' as shown in FIG. 4c.

Figure 4D:
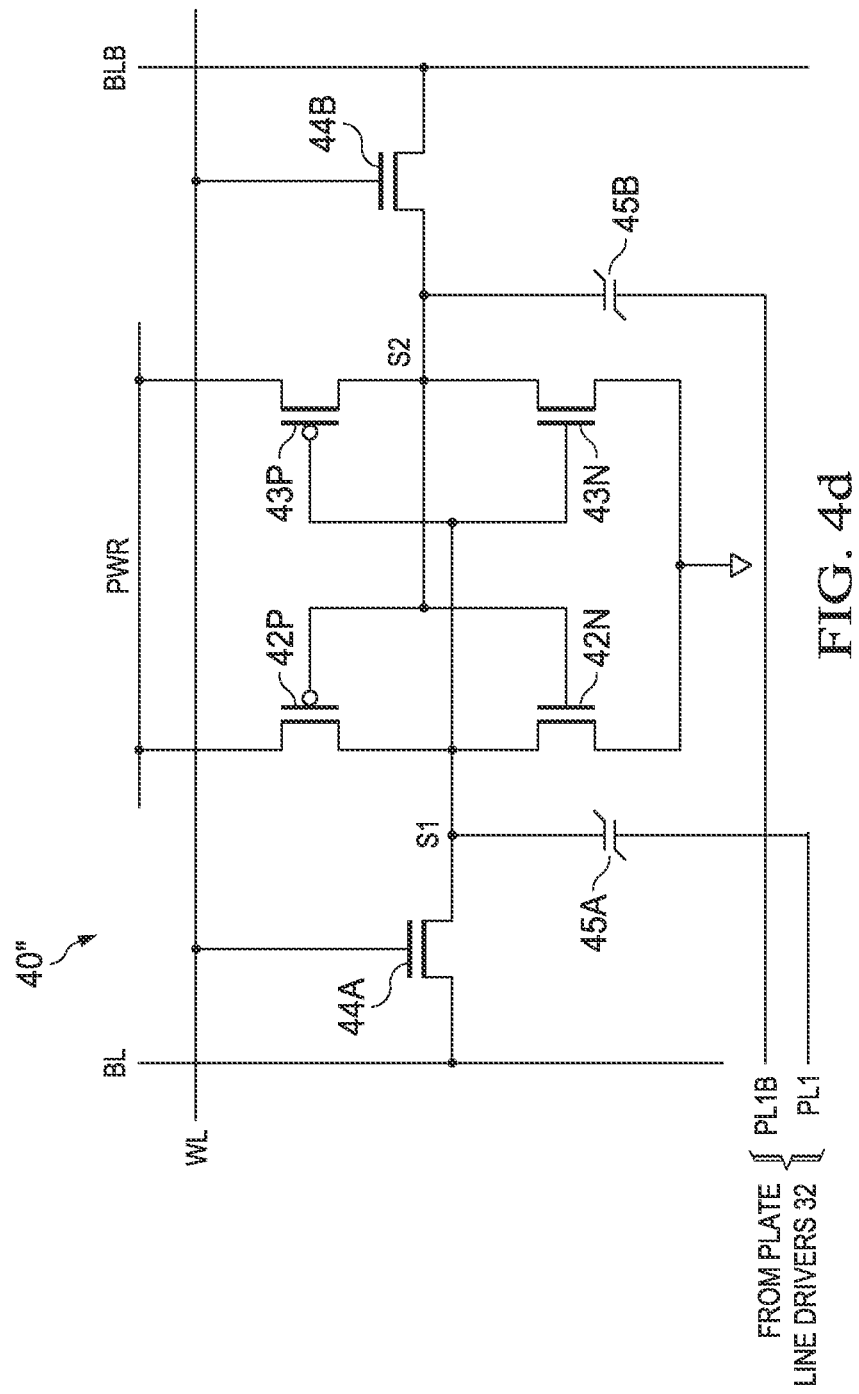

Another alternative memory cell construction in connection with which the margin test of embodiments of this invention may be used is illustrated in FIG. 4d, by way of memory cell 40". Memory cell 40" is constructed similarly to memory cell 40 described above in connection with FIG. 4b, with the exception that ferroelectric capacitors 47A, 47B are not present. More specifically, as shown in FIG. 4d, memory cell 40" includes only ferroelectric capacitor 45A connected between storage node S1 and plate line PL1, and ferroelectric capacitor 45B connected between storage node S2 and plate line PL1B. Plate line PL2 is not provided, as it is unnecessary.

Memory cell 40" carries out SRAM read and write operations in the conventional manner for CMOS SRAM cells, by way of storage nodes S1, S2 communicating with bit lines BL, BLB, respectively, via pass gates 44A, 44B. Programming of the current latch state into ferroelectric capacitors 45A, 45B is performed in the same manner as described above and in Miwa et al., "A 512 Kbit low-voltage NV-SRAM with the size of a conventional SRAM", *Digest of Technical Papers: Symposium on VLSI Circuits*, Paper 12-4 (IEEE, 2001), pp. 129-132, incorporated herein by reference. To summarize, programming of ferroelectric capacitors 45A, 45B is carried out by driving plate lines PL1, PL1B to ground for a desired duration, and then to a high voltage such as $V_{dd}$ for a desired duration.

The non-volatile recall operation of memory cell 40' is performed (in normal use other than the margin test) by driving a high voltage at plate lines PL1, PL1B, followed by powering-up memory cell 40" (power supply node PWR driven toward $V_{dd}$). As in the case of memory cells 40, 40', this pulsing of plate lines PL1, PL1B will repolarize the one of ferroelectric capacitors 45A, 45B that was polarized to the "−1" state by its storage node S1, S2 (i.e., the one of storage nodes S1, S2 latched to a "1" level); this polarization charge, which is reflected in a higher apparent capacitance, will cause its associated storage node to rise faster toward $V_{dd}$ in response to the plate line voltage than will the other storage node. Upon powering-up of memory cell 40" from power supply node PWR, this differential voltage at storage nodes S1, S2 will be latched.

Stability margin test 80 of FIG. 6a is performed upon memory cells 40" in the same manner as described above. The one of plate lines PL1, PL1B associated with the storage node S1, S2 that was previously in its "1" logic state will receive a reduced voltage, corresponding to the voltage on line ΔV, during the disturbed recall operation than will the other plate line. This reduced voltage will result in a reduced differential voltage across storage nodes S1, S2. Those memory cells 40" with less operating margin, due to either weak polarization behavior of its ferroelectric capacitors 45A, 45B or due to device imbalances, or both, will tend to latch into the wrong data state at a lower value of voltage ΔV than will stronger memory cells 40".

Stability margin test 80 according to embodiments of this invention is thus well-suited for use in connection with memory cells of various construction. According to embodiments of this invention, stability margin test 80 can also be applied to latches in logic circuits, such as latches included in conventional flip-flops (i.e., bistable multivibrators), as will now be described in detail in connection with FIGS. 5a and 5b.

Figure 5A:
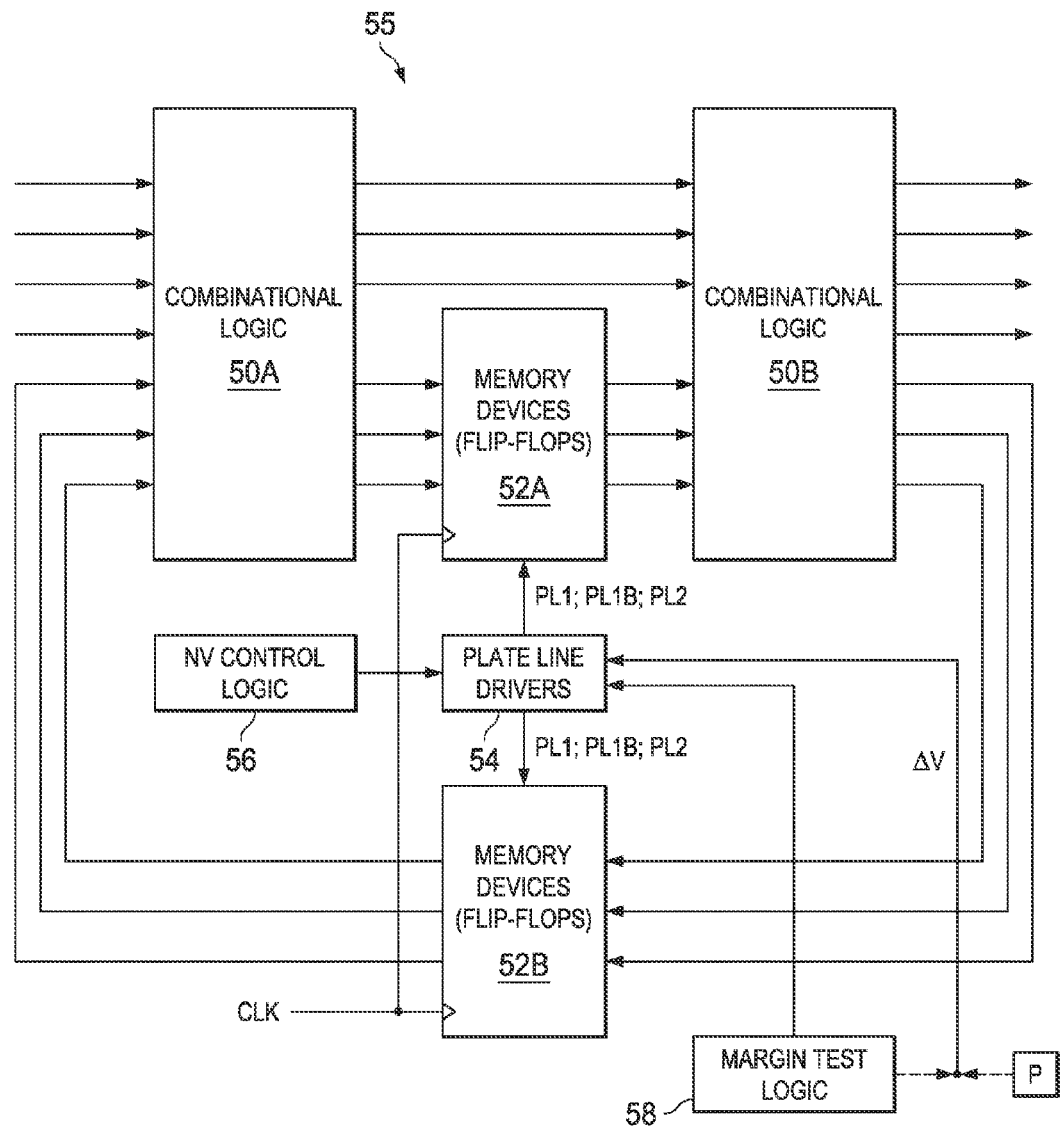
FIG. 5a is an electrical diagram, in block form, of logic circuitry constructed according to embodiments of this invention.

Non-volatile retention of data states at nodes within large scale logic circuits and functions is a useful capability. FIG. 5a illustrates, in generic fashion, logic circuitry 55 that includes non-volatile memory devices, such as flip-flops, constructed according to embodiments of this invention. In this generic arrangement, combinational logic 50A performs logic operations on various data inputs received from external to logic circuitry 55, in combination with feedback inputs; results of those operations are forwarded to combinational logic 50B for further processing, or to memory devices 52A. Combinational logic 50B performs logic functions and operations on data from combinational logic 50A and some of the contents of memory devices 52A, to produce output data and also feedback data forwarded to memory devices 52B. Contents of memory devices 52B are forwarded to combinational logic 50A as feedback inputs. As such, in this generic logic arrangement, memory devices 52A are present within the forward logic data flow, while memory devices 52B serve as "state" memory in a feedback loop such that logic circuitry 55 operates as sequential logic (i.e., a state machine). Either or both of these types of memory devices 52A, 52B may be present in a specific logic circuit.

In embodiments of this invention applicable to logic circuits such as logic circuitry 55, some or all of memory devices 52A, 52B are constructed as non-volatile memory circuits, for example as non-volatile flip-flops. In this flip-flop implementation, memory devices 52A, 52B receive clock input CLK, which controls the storing of data states within memory devices 52A, 52B, in a synchronous fashion; of course, memory devices 52A, 52B may also be realized as asynchronous latches, if desired.

Figure 5B:
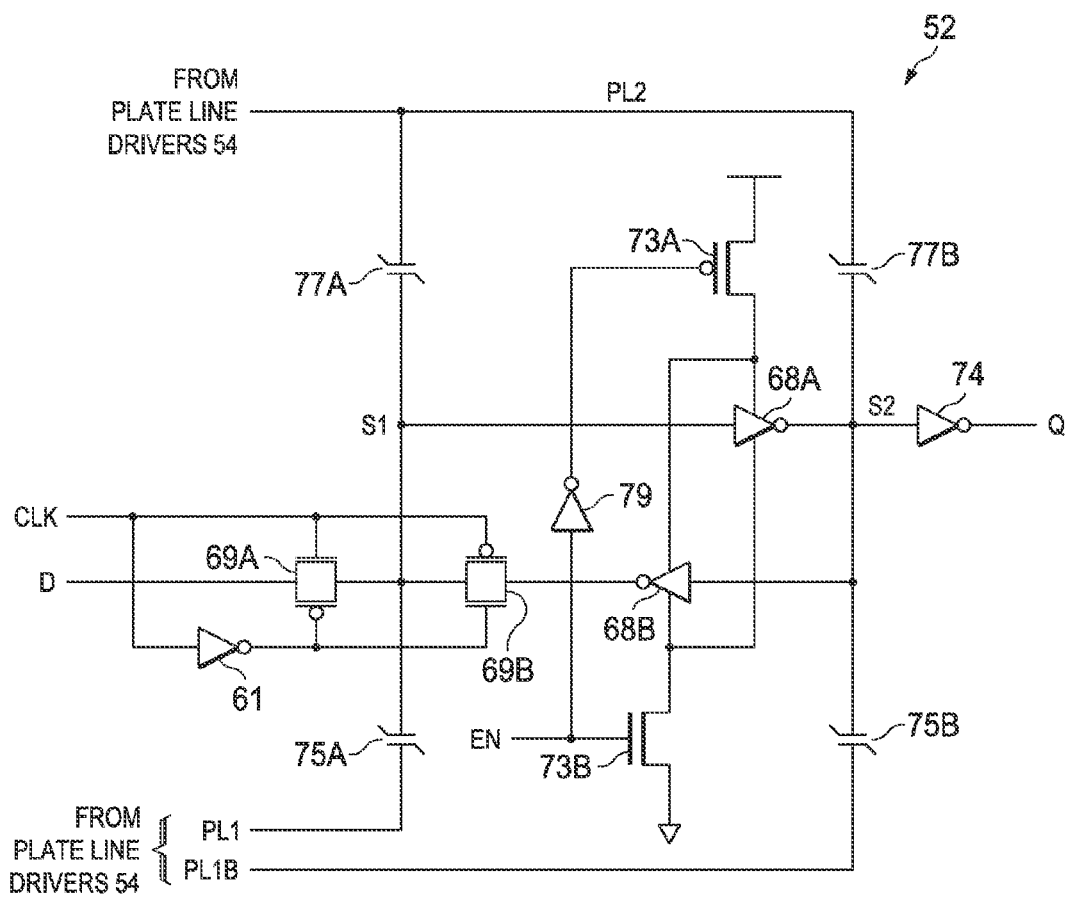
FIG. 5b is an electrical diagram, in schematic form, of a flip-flop constructed according to embodiments of this invention.

FIG. 5b illustrates the construction of non-volatile flip-flop 52 according to embodiments of this invention; it is to be understood, of course, that the particular construction of flip-flop 52 can vary from the example shown in FIG. 5b, without departing from the scope of this invention. As shown in FIG. 5b, pass gate 69A of flip-flop 52 receives input data line D, and operates to connect input data line D to storage node S1 responsive to a high logic level of clock signal CLK. Pass gate 69B is connected between the output of inverter 68B and storage node S1, and is also clocked by clock signal CLK but in complementary fashion relative to pass gate 69A. In this example, pass gates 69A, 69B are constructed as CMOS pass gates of a p-channel MOS transistor in parallel with an n-channel MOS transistor, the gates of which receive complementary versions of clock signal CLK (i.e., clock signal CLK itself and via inverter 61). Pass gate 69A is thus turned on when pass gate 69B is turned off, and vice versa.

Flip-flop 52 is based on CMOS inverters 68A, 68B, which are connected in cross-coupled fashion. The output of inverter 68B drives storage node S1 via pass gate 69B, as mentioned above, and storage node S1 is connected to the input of inverter 68A. Conversely, the output of inverter 68A drives storage node S2, which in turn is connected to the input of inverter 68B. Inverters 68A, 68B are biased from power supply node PWR via p-channel transistor 73A, and to ground by n-channel transistor 73B, the gates of which receive enable signal EN (inverted by inverter 79 in the case of transistor 73A). Enable signal EN thus controls whether flip-flop 52 is powered-up or powered-down, regardless of whether the rest of the integrated circuit is powered-up. The output of flip-flop 52 in this example is presented at output data line Q, buffered from storage node S2 by inverter 74. Of course, other input circuitry and output buffer circuitry may be provided in connection with flip-flop 52 as desired, it being understood that flip-flop 52 of FIG. 5b is presented by way of example only.

Non-volatile storage of the state of flip-flop 52 (i.e., during such times as enable signal EN is inactive low) is provided by ferroelectric capacitors 75A, 75B, 77A, 77B. Ferroelectric capacitor 75A is connected between storage node S1 and plate line PL1, and ferroelectric capacitor 77A is connected between storage node S1 and plate line PL2. Similarly, ferroelectric capacitor 75B is connected between storage node S2 and plate lines PL1B, and ferroelectric capacitor 77B is connected between storage node S2 and plate line PL2. As in the case of memory cells 40, 40', ferroelectric capacitors 77A, 77B are typically larger than corresponding ferroelectric capacitors 75A, 75B, so that a capacitive voltage divider is presented to storage nodes S1, S2 in recall operations as described above. As evident from this description, plate lines PL1, PL1B enable the application of different voltages to ferroelectric capacitors 75A, 75B relative to one another.

Referring back to FIG. 5a, logic circuitry 55 includes or cooperates with certain support circuitry in connection with the non-volatile operation of memory devices 52A, 52B. Plate line drivers 54 drive voltages onto plate lines PL1, PL1B, PL2 to the non-volatile flip-flops 52, under the control of non-volatile control logic 56 (which receives control signals from elsewhere in the integrated circuit, for example indications that the integrated circuit is powering up or powering down). In addition, according to this embodiment of the invention in which stability margin tests are performed using specific bias voltages on plate lines PL1, PL1B, PL2, margin test logic 58 is provided to control plate line drivers 54 accordingly. Control voltage signal ΔV is provided to plate line drivers 54, either from special device pad P or from margin test logic 58 itself.

The operation of flip-flop 52 in its non-volatile operation of programming ferroelectric capacitors 75A, 75B, 77A, 77B with the current state at storage nodes S1, S2, and in restoring that state on power-up, is similar to that described above in connection with memory cells 40, 40' of FIGS. 4b and 4c, respectively. As such, stability margin test 80 as described above in connection with FIG. 6*a* can be performed in essentially the identical manner for flip-flops 52, by plate line drivers 54 presenting a reduced plate line voltage indicated on line $\Delta V$ on the one of plate lines PL1, PL1B associated with the storage node S1, S2, respectively, at which a "1" logic level had been latched. Of course, the manner in which the latches under test in flip-flops 52 are set to "1" and "0" states in processes 84, 96 (FIG. 6*a*), and the manner in which the states of those latches under test are read in processes 94, 106, will differ in this logic circuit implementation from that of memory cells 40. More specifically, the logic data path may be used to set and retrieve the logic states. For examples of write processes 84, 96 of FIG. 6*a*, an output of combinational logic 50A (FIG. 5*a*) coupled to input data line D will set flip-flop 52 upon clock signal CLK at an active high level, after which a low level of clock signal CLK will isolate storage nodes S1, S2 from input data line D. Power down processes 88, 100 can be performed at flip-flop 52 by enable signal EN driven to a low level, after which the differential voltages on plate lines PL1, PL1B can be applied in processes 90, 102, followed by enable signal EN again driven high in processes 92, 104. Reading of the state restored in flip-flop 52 can then be accomplished after power up, by inverting buffer 74 driving an output level on line Q. Alternatively, a scan test path (not shown) may set and retrieve the appropriate logic states of flip-flop 52 and other memory devices 52A, 52B.

It is contemplated that, in some circumstances, the specific data state at storage nodes S1, S2 of flip-flop 52 may not be known, or may not be independently settable relative to other flip-flops 52 or logic circuitry. According to embodiments of this invention, stability margin testing of flip-flops 52 may still be performed, as will now be described in connection with FIG. 6*b* in connection with a single flip-flop 52 for the sake of clarity. Of course, those skilled in the art having reference to this specification will comprehend that the margin test of FIG. 6*b* can simultaneously test multiple flip-flops 52. In process 108, the latches under test in one or more flip-flops 52 are set into a first state, which may or may not be known or knowable. Margin test 82A, consisting of processes 86, 88, 90, 92, 94 described above in connection with FIG. 6*a* for the case of plate line PL1 at a reduced voltage relative to plate line PL1B, is then performed on flip-flop 52. In process 110, the resulting recalled state in test 82A is compared with the original data state set in process 108. Comparison process 110 may simply compare the recalled state with that set (e.g., by way of an exclusive-OR function) to determine whether the states are different from one another (regardless of logic level). Assuming that the original data state was correctly recalled as a result of test 82A, margin test 82B is then performed on flip-flop 52, test 82B consisting of processes 98, 100, 102, 104, 106 in which plate line PL1B receives a reduced voltage relative to plate line PL1 in the recall operation. In process 112, the data state recalled following test 82B is then compared with that set, to determine whether the disturbed recall caused a latch failure. This process is then repeated beginning with process 114 which sets a complementary state in flip-flop 52 (whatever that state happens to be), followed by a sequence of margin test 82A, comparison of the recalled state with the set state in process 116, margin test 82B, and comparison of the recalled state with the set state in process 118.

In short, the margin test process of FIG. 6*b* disturbs the recall voltage at storage nodes S1, S2 in both directions: in one direction favoring the state to be recalled, and in the other direction weakening the state to be recalled. In this case in which the latch cannot be set in the desired logic state or in a knowable logic state, the test ensures that the worst case disturb condition is applied to flip-flop 52, by testing all four combinations of set data state and disturb voltage polarity.

According to the embodiments of the invention described above, therefore, the stability margin of non-volatile latches such as in static RAM memory cells, and in flip-flops or state memories in logic circuits, and in other circuits, can be directly tested at the time of manufacture. Such a test can be very useful in removing, from the device population, those non-volatile circuits and elements that are prone to failure in system use due to repeated polarization (i.e., program and recall) cycles or degradation over time and temperature. In addition, because the latch margin is tested by operating the latch itself in a recall operation, the effect of device imbalance in the latch circuitry itself in combination with polarization weakness in the capacitors is evaluated in the margin test, improving the effectiveness of the margin test and its correlation with later-life degradation.

Figure 7A:
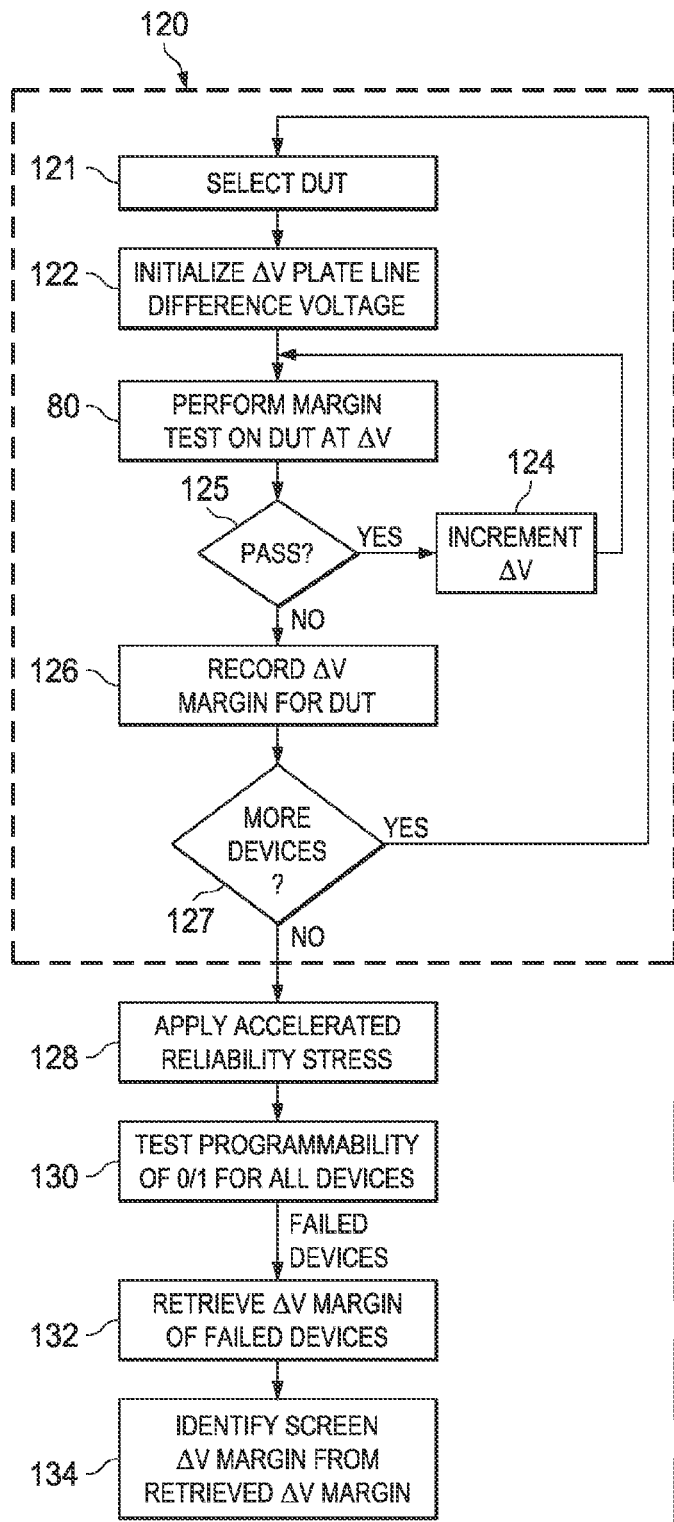
FIGS. 7a and 7b are flow diagrams illustrating methods of characterizing a screen voltage for use in the test processes of FIGS. 6a and 6b according to embodiments of this invention.

In order for the stability margin tests of FIGS. 6*a* and 6*b* to be effective, an appropriate plate line difference voltage (e.g., difference between the voltages applied to plate lines PL1, PL1B) corresponding to the expected reliability shift must be selected. Selection of an optimized difference voltage value $\Delta V$ will ensure that the stability margin tests of FIGS. 6*a* and 6*b* remove those integrated circuits that are likely to fail over usage and time, while not unduly depressing manufacturing yield. Referring now to FIG. 7*a*, a method of determining an appropriate screen voltage $\Delta V$ to be used in a manufacturing test, according to an embodiment of the invention, will now be described.

The method of FIG. 7*a* operates on a population of non-volatile circuits including ferroelectric capacitors. It is contemplated that such a population is typically based on a population of integrated circuits, each containing multiple memory cells 40 or flip-flops 52 that will be subjected to the margin screens performed in this method. In that case, it is contemplated that the worst individual memory cell 40 or flip-flop 52 will be characterized in determining the eventual screen voltage DV according to this method. Alternatively, it is contemplated that the population evaluated may be constituted by the multiple individual memory cells 40 or flip-flops 52 within a single (or a few) integrated circuit, each of these individual memory cells 40 or flip-flops 52 being separately characterized. However, because the failure of any individual memory cell 40 or flip-flop 52 within an integrated circuit generally causes the entire integrated circuit to be considered a reliability failure, and also because variations in manufacturing parameters are reflected in variations in the reliability of these devices, it is contemplated that the method of FIG. 7*a* is best applied to a population of integrated circuits.

For the population of ferroelectric devices to test, as mentioned above whether referring to individual cells 40 (or flip-flops 52) or integrated circuits, the method of FIG. 7*a* begins with process 121 in which a ferroelectric device is selected for test. In process 122, an initial plate line difference voltage $\Delta V$ is selected; this voltage $\Delta V$ corresponds to the difference in voltages to be applied to plate lines PL1, PL1B in a first instance of the stability margin test 80 described above. In this example, the device under test ("DUT") selected in process 122 is repeatedly tested with increasing difference voltages $\Delta V$ beginning with a small difference voltage $\Delta V$ (or, indeed, no difference voltage if the DUT has not yet had its programmability tested), until failure. As such, the selected DUT is subjected to stability margin test 80 with the initial difference voltage $\Delta V$, testing both data states for each ferroelectric cell 40 or flip-flop 52 of the DUT in the manner described above in connection with FIG. 6*a*. Decision 125 determines whether the selected DUT passed the stability margin test for the initial difference voltage ΔV; if so, difference voltage ΔV is incremented in process 124, and stability margin test 80 is repeated for the selected DUT.

Upon decision 125 indicating that the selected DUT has failed stability margin test 80, the difference voltage ΔV at which this DUT first failed margin test 80 is recorded, in process 126, in a manner that is linked to this DUT. Decision 127 is then performed to determine whether additional devices in the population being characterized remain to be tested. If so, another DUT is selected in process 121 and the process is repeated for that DUT.

According to this embodiment of the invention, characterization process 120 (which refers to the loop of processes 121, 122, 80, 126 etc. as shown in FIG. 7a) may be performed in whole or in part by conventional automated test equipment as controlled by an automated characterization test program, or alternatively by automated test equipment or laboratory equipment under the control and supervision of engineering personnel. It is contemplated that those skilled in the art having reference to this specification will readily recognize various approaches to carrying out characterization process 120 and the remainder of the processes described in FIG. 7a.

Once each device in the population has had its stability margin value recorded in process 126, the population of devices is then subjected to an accelerated reliability stress in process 128. The accelerated stress of process 128 corresponds to a conventional stress environment, such as a high temperature bake, known to accelerate the degradation of the programmability of ferroelectric capacitors (e.g., developing a "preference" for one of the polarization states by way of the imprint mechanism). One example of an accelerated stress that mimics end-of-life, under normal system use, is an unbiased high temperature bake at 125° C. for 1000 hours. In addition, if desired, stress level power supply voltages may be applied to the devices in process 126, for example to accelerate shifts in device threshold voltages and the like.

Following accelerated stress process 128, the population of devices is then tested in process 130 to determine whether any devices cannot be programmed to store and recall both data states. It is contemplated that process 130 will be performed simply by sequentially programming and then recalling (after a power-down) both "0" and "1" data states in the ferroelectric capacitors of cells 40 and flip-flops 52, as the case may be. It is contemplated that process 130 will be performed with zero difference voltage ΔV on plate lines PL1, PL (i.e., as though operating in normal program and recall fashion), although some guardband difference voltage ΔV between plate lines PL1, PL1B may be used if desired, for example to account for variations among testers and the like. Those devices in the post-stress population that fail process 130 are then identified, and their pre-stress difference voltage ΔV margin stored in process 126 is then retrieved, in process 132. In process 134, the pre-stress difference voltage ΔV margin of these failed devices is analyzed, to determine a statistically significant maximum pre-stress difference voltage ΔV margin of the failed devices that can operate to segregate those devices that will fail the reliability stress conditions of process 128 from those that will survive such accelerated stress. This difference voltage ΔV can then be used as a time-zero screen, for example as a manufacturing test for integrated circuits to be produced. In some cases, it may also be useful to retrieve and analyze the pre-stress difference voltage ΔV margin of those devices that pass test 130 after the stress of process 128, to ensure that the eventual screen difference voltage ΔV margin will operate with acceptable error margins in both directions (i.e., acceptable false positive rates, and acceptable false negative rates).

Figure 7B:
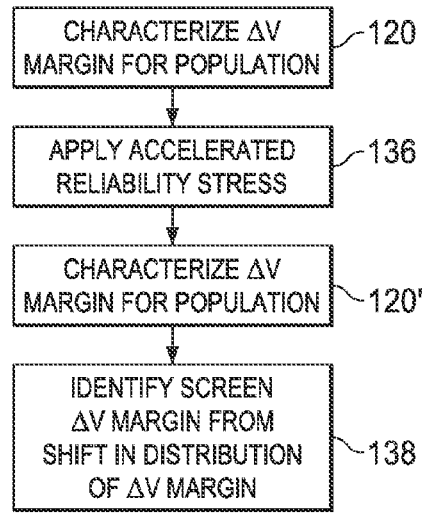

FIG. 7b illustrates an alternative approach to characterizing and deriving a difference voltage ΔV to be used in a manufacturing screen. In the embodiment of the invention shown in FIG. 7b, either a one-to-one recording of first failed difference voltage ΔV margin for each device is not possible, or alternatively such a one-to-one correspondence is not particularly accurate (i.e., false positive and false negative error rates are too high). This alternative method operates in essentially a statistical manner, by statistically evaluating shifts in the distribution of difference voltage ΔV margin pre-stress versus post-stress.

The process of FIG. 7b begins with pre-stress characterization of a population of devices, according to characterization process 120 as described in FIG. 7a. The result of characterization process 120 will, as described above, provides a distribution of the difference voltage ΔV margins at which each of the population of devices first failed the programmability test 80. In process 136, an accelerated reliability stress is applied to this population of devices, for example by way of a high temperature bake with or without a stress power supply voltage applied. In process 120', characterization process 120 of FIG. 7a is repeated for the population of devices, to obtain a distribution of the difference voltage ΔV margin for each device in the population following the reliability stress of process 136. In process 138, the post-stress and pre-stress distributions of difference voltage ΔV margins for the population of devices are compared. It is contemplated that various statistical parameters may be analyzed in this process 138, for example comparison of the means of the distributions, or variances of the difference voltage ΔV margins (e.g., two standard deviations below the mean). Upon such comparison in process 138, a difference voltage ΔV margin for the manufacturing screen can be derived from the observed shift of the difference voltage ΔV margin caused by the accelerated stress of process 136.

Once the difference voltage ΔV for the manufacturing screen is selected, for example by way of the processes of FIGS. 7a and 7b and variations thereof that are apparent to those skilled in the art having reference to this specification, integrated circuits including ferroelectric capacitors and storage devices as described above can now be tested, at the time of manufacture or prior to assembly into larger-scale electronic systems and the like, to identify and remove those integrated circuits that are subject to later life failure to reliably program and recall, in the non-volatile sense, stored data and operational states. This time-zero screen can be performed, for example, by way of test process 80 of FIG. 6a described above, and variations thereof apparent to those skilled in the art having reference to this specification.

According to another embodiment of this invention, as will now be described with reference to FIG. 8, the plate line margin test approach described above is used in conjunction with a short high temperature bake as a time-zero screen of weak ferroelectric capacitors. As described in copending and commonly assigned U.S. patent application Ser. No. 12/142, 568, published as U.S. Patent Application Publication No. US 2009/0316469 A1, incorporated herein by reference, an early fail mechanism for ferroelectric memory cells can be reflected by weak polarization behavior at manufacture, and a relatively short high temperature "depolarization" bake can be used to detect that weak behavior. According to this embodiment of the invention, a margin screen using the plate line voltage approach described above is combined with a short high temperature bake to provide an especially effective time-zero screen of weak ferroelectric capacitors. The term "time-zero", in this context, refers to the time after manufacture of the memory and before its installation in its eventual end product use or application. If performed by the manufacturer of the ferroelectric memory or integrated circuit in which the memory is embedded, this time-zero screen may be performed while the memory is in wafer form or after packaging, or both; alternatively, if performed by the system implementer, this time-zero screen may be performed prior to assembly of the integrated circuit into the system (e.g., prior to attachment to a circuit board).

As shown in FIG. 8, the process begins with process 140, in which all ferroelectric memory cells 40 in a given device under test (DUT) are programmed to known data state, for example a "0" data state (storage node S1 at "0" and storage node S2 at "1"). Programming process 140 may be performed in the manner described above, for example by writing the "0" data state to the CMOS latch in each cell 40, and then pulsing the plate line voltages (e.g., processes 96, 98 of FIG. 6b). In process 142, the DUT (and other devices that may be undergoing the same screen at the same time) is subjected to a short unbiased high temperature bake, which of course requires powering-down of the DUT. The bake conditions of process 142 subjects the DUT to a sufficient temperature for a sufficient time to degrade the polarization state of the capacitors. An example of the bake conditions for process 140 is a bake with a peak temperature of about 245° C. to about 260° C. for about 30 seconds, performed once or repeated for up to three times, for example with a time-temperature profile mimicking the lead-free solder reflow profile described in *Joint Industry Standard: Moisture/Reflow Sensitivity Classification for Nonhermetic Solid State Surface Mount Devices*, IPC/JEDEC J-STD-020D.1 (March 2008), pp. 4, 7, and 8, incorporated herein by reference. Another example of the conditions of bake process 140 is a bake for about two hours or less at temperatures ranging from 150° C. to 200° C. In general, shorter bake times require higher temperatures to obtain the same effect. The particular bake conditions will depend on product requirements. A trade-off of the bake time with device throughput through the time zero screen will generally be made.

After bake process 142, process 144 performs a "recall" operation of the "0" data state programmed into cells 40 of the DUT, but with a reduced plate line voltage applied as described above. In the example cells 40 constructed as described above relative to FIG. 4b, and in which the "0" data state is being recalled into, plate lines PL1B in each of cells 40 will receive a reduced plate line voltage, by a selected differential voltage $\Delta V1$, relative to the plate lines PL1 in each of cells 40 of DUT (as in process 102 of FIG. 6a). Recall operation 144 is then completed by the powering-up of cells 40 (as in process 104 of FIG. 6a). As described above, the reduced plate line voltage is applied to the plate line (PL1B in this case) corresponding to the storage node (S2) at which the "1" data level is expected to be restored. The differential voltage $\Delta V1$ is selected by the test designer, based on characterization or previous test results, to reflect a test margin reflective of expected polarization degradation over time and system use, as described above. For example, this differential voltage $\Delta V1$ may be based on the results of the characterization method described above in connection with FIGS. 7a and 7b. In process 146, cells 40 in the DUT are read to determine whether the correct "0" data state was successfully recalled in process 144, despite the reduced plate line voltage differential voltage $\Delta V1$ applied to the "strong" side plate line (PL1B). If any cells 40 of the DUT return a "1" data state (decision 147 is "yes"), those cells are identified for "repair" (i.e., replacement by a redundant cell in the memory) or simply as a failed cell, in process 148.

If all cells 40 in the DUT pass the read operation of process 146 (decision 147 is "no"), the test procedure can continue in one of a number of ways. According to one option, test process 150 may be applied to determine whether the ferroelectric capacitors in cells 40 are subject to an "imprint" in the "0" direction. In this optional process 150, all cells 40 of the DUT are programmed to the opposite "1" data state in process 152, and the DUT is powered down. Recall operation 154 is then performed to recall the "1" data state into each of cells 40, but with a reduced plate line voltage applied to plate line PL1 in this case, as plate line PL1 is associated with storage node S1 at which the "1" data state is expected. The amount of the reduction in recall process 154, namely differential voltage $\Delta V2$, may differ from differential voltage $\Delta V1$ of process 144, as appropriate for the desired test. Cells 40 are then read in process 156, to determine whether the "1" data state was able to be successfully programmed in process 152 despite the effects of the previous "0" data state short bake in process 142, with a margin corresponding to differential voltage $\Delta V2$ (i.e., reflective of expected degradation over time). Any cells 40 that returned a "0" data state in read process 156 (i.e., decision 157 is "yes") are identified, and repaired if desired, in process 148. If no cells returned a "0" data state (decision 157 is "no"), the time-zero screen of the DUT may, if desired, be considered to have passed and the test may be ended.

Alternatively, after either a "no" result from decision 147, or a "no" result from decision 157, the time-zero screen procedure may be applied to the DUT may be repeated for the opposite data state. It is contemplated that the decision of whether to test the DUT for both data states can be made by test personnel from analysis of time-zero and life test results of the integrated circuit population, acquired over time. For this opposite data state, ferroelectric cells 40 in the DUT are programmed to a "1" state in process 160, and then the DUT is subjected to a short high temperature depolarization bake, in process 162. In process 164, the programmed data state is recalled to each of cells 40 in the DUT, with a reduced voltage at the "strong" side plate lines. In this case, because the programmed data state is "1", the voltage at plate lines PL1 (associated with storage node S1 in each of cells 40) receives a voltage that is reduced by differential voltage $\Delta V1$ from that applied to plate line PL1B, to obtain an indication, at time-zero, of the end-of-life behavior of cells 40 in the DUT in connection with program-and-recall capability. In process 166, cells 40 are each read to determine whether the programmed "1" data state was successfully recalled. If any cells 40 do not return a "1" data state in process 166 (decision 167 is "yes"), those cells 40 are repaired or otherwise identified in process 168. If all cells return the "1" data state (decision 167 is "no"), the test procedure may optionally end.

According to another optional test flow, program and recall testing of the opposite data state, after the depolarization bake of process 162, can also be performed in process 170, beginning with process 172 in which all cells 40 are programmed with the opposite "0" data state, and the DUT is powered down. A recall operation is then performed for all cells 40 in the DUT, in process 174, but with a reduced voltage at the "strong" side plate line, which in this case is plate line PL1B for each cell 40, relative to the other plate line (PL1). The differential voltage $\Delta V2$ in process 174 will likely differ from differential voltage $\Delta V1$, as mentioned above. In process 176, the state of each cell 40 is read to determine whether the "0" data states were properly recalled; if not (decision 177 is "no"), those cells 40 are repaired or otherwise identified in process 168. If all cells 40 pass this read test process 176, the margin screen of this embodiment of the invention is complete for this DUT.

According to this embodiment of the invention, the ability to apply reduced and differential voltages to complementary plate lines of each cell enables the ability to perform a time-zero margin screen in a manner that includes a short accelerated stress, namely a short high temperature bake. The combination of the margin screen and this short bake allows for accurate identification of weak cells within a memory device or embedded memory, enabling the appropriate redundant repair or discarding of the device. The improved accuracy provided by the combination of the bake and margin screen is contemplated to reduce the number of false time-zero failures (i.e., improve test yield) and also improve the overall system reliability of the device population.

Embodiments of this invention therefore provide the important benefit of a time-zero electrical test that can accurately and efficiently identify weak ferroelectric elements and latch circuits utilizing such elements, such as in memory cells and flip-flops, in the sense that these ferroelectric elements are vulnerable to later life shifts in their ability to provide non-volatile storage. This electrical test and characterization not only provides a direct evaluation of the ferroelectric elements themselves, but tests these elements in the very context of their latches and other circuit implementations that rely on the non-volatile capability of these elements. As a result, device imbalances, worst-case voltage conditions, and the like that affect the CMOS or other latches and surrounding circuits to these ferroelectric elements are also included in the electrical test, further improving the fidelity of this test.

While the present invention has been described according to certain of its embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of testing a non-volatile latch circuit in an integrated circuit, the latch circuit comprising cross-coupled inverters driving first and second storage nodes, a first ferroelectric capacitor having a first plate coupled to the first storage node, and a second ferroelectric capacitor having a first plate coupled to the second storage node, the method comprising:
   setting the state of the latch circuit so that the first and second storage nodes are at low and high logic states, respectively;
   then polarizing the first and second ferroelectric capacitors to opposite polarization states, corresponding to the state of the latch circuit, by applying low and high bias voltages to a second plate of the first ferroelectric capacitor and a second plate of the second ferroelectric capacitor;
   then removing bias from the cross-coupled inverters of the latch circuit;
   then biasing the second plate of the first ferroelectric capacitor to a first bias voltage, and biasing the second plate of the second ferroelectric capacitor to a second bias voltage, the second bias voltage lower than the first bias voltage by a selected differential;
   then applying bias to the cross-coupled inverters of the latch circuit; and
   then reading the state of the latch circuit.

2. The method of claim 1, wherein the latch circuit further comprises a third ferroelectric capacitor having a first plate coupled to the first storage node and a second plate coupled to a second plate line, and a fourth ferroelectric capacitor having a first plate coupled to the second storage node and a second plate coupled to the second plate line; and wherein the method further comprises:
   during the polarizing step, applying low and high bias voltages to the second plate line; and
   during the biasing step, applying a ground voltage to the second plate line.

3. The method of claim 1, wherein the latch circuit corresponds to a static random access memory cell, the memory cell further comprising first and second pass gates having a conduction path coupled between the first and second storage nodes and first and second complementary bit lines, respectively, and having a control terminal receiving a word line; and wherein the method further comprises:
   turning off the first and second pass gates during the biasing step.

4. The method of claim 3, wherein the reading step comprises:
   turning on the first and second pass gates;
   sensing a differential signal from the first and second complementary bit lines; and
   communicating a logic signal corresponding to the sensed differential signal.

5. The method of claim 1, wherein the latch circuit corresponds to a stage in a logic circuit, the logic circuit further comprising a first stage having an output coupled to one of the first and second sense nodes, and a second stage having an input coupled to one of the first and second sense nodes; wherein the method further comprises:
   isolating the first and second sense nodes from the first and second stages during the biasing step; and wherein the reading step comprises:
      driving an output logic level from the second stage corresponding to the state of the latch circuit.

6. The method of claim 1, further comprising:
   setting the state of the latch circuit so that the first and second storage nodes are at high and low logic states, respectively;
   then polarizing the first and second ferroelectric capacitors by applying low and high bias voltages to each of the second plates of the first and second ferroelectric capacitors;
   then removing bias from the cross-coupled inverters of the latch circuit;
   then biasing the second plate of the first ferroelectric capacitor to the second bias voltage, and biasing the second plate of the second ferroelectric capacitor to the first bias voltage, the second bias voltage lower than the first bias voltage by the selected differential;
   then applying bias to the cross-coupled inverters of the latch circuit; and
   then reading the state of the latch circuit.

7. The method of claim 1, further comprising:
   after the step of removing bias and before the step of then biasing the second plate of the first ferroelectric capacitor, stressing the integrated circuit.

8. The method of claim 7, wherein the stressing step comprises:
   baking the integrated circuit at an elevated temperature for a selected duration.

9. The method of claim 8, further comprising:

after the reading step, setting the state of the latch circuit so that the first and second storage nodes are at high and low logic states, respectively;

then polarizing the first and second ferroelectric capacitors by applying low and high bias voltages to each of the second plates of the first and second ferroelectric capacitors;

then removing bias from the cross-coupled inverters of the latch circuit;

then biasing the second plate of the first ferroelectric capacitor to the second bias voltage, and biasing the second plate of the second ferroelectric capacitor to the first bias voltage, the second bias voltage lower than the first bias voltage by a second selected differential;

then applying bias to the cross-coupled inverters of the latch circuit; and then reading the state of the latch circuit.

10. The method of claim 8, further comprising:

after the reading step, setting the state of the latch circuit so that the first and second storage nodes are at high and low logic states, respectively;

then polarizing the first and second ferroelectric capacitors by applying low and high bias voltages to each of the second plates of the first and second ferroelectric capacitors;

then removing bias from the cross-coupled inverters of the latch circuit;

then baking the integrated circuit at an elevated temperature for a selected duration;

then biasing the second plate of the first ferroelectric capacitor to the second bias voltage, and biasing the second plate of the second ferroelectric capacitor to the first bias voltage, the second bias voltage lower than the first bias voltage by the selected differential;

then applying bias to the cross-coupled inverters of the latch circuit; and then reading the state of the latch circuit.

* * * * *